(12) United States Patent
Bertanzetti

(10) Patent No.: US 8,214,704 B1
(45) Date of Patent: *Jul. 3, 2012

(54) SCAN TESTING SYSTEM AND METHOD

(75) Inventor: Darren Bertanzetti, Thornton, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/235,278

(22) Filed: Sep. 16, 2011

Related U.S. Application Data

(63) Continuation of application No. 11/982,937, filed on Nov. 6, 2007, now Pat. No. 8,024,631.

(60) Provisional application No. 60/864,655, filed on Nov. 7, 2006.

(51) Int. Cl.
*G01R 31/28* (2006.01)

(52) U.S. Cl. .................... 714/729; 714/732

(58) Field of Classification Search ............ 714/27, 714/724, 726, 727, 729, 731, 732
See application file for complete search history.

(56) References Cited

U.S. PATENT DOCUMENTS

| | | | | |
|---|---|---|---|---|
| 5,260,946 A | * | 11/1993 | Nunally | 714/724 |
| 5,631,910 A | * | 5/1997 | Nozuyama et al. | 714/724 |
| 5,822,228 A | * | 10/1998 | Irrinki et al. | 714/718 |
| 6,510,534 B1 | * | 1/2003 | Nadeau-Dostie et al. | 714/724 |
| 6,898,749 B2 | * | 5/2005 | Whetsel et al. | 714/729 |
| 7,099,783 B2 | * | 8/2006 | Hasegawa et al. | 702/57 |
| 7,194,669 B2 | * | 3/2007 | Nadeau-Dostie | 714/726 |
| 7,237,162 B1 | * | 6/2007 | Wohl et al. | 714/726 |
| 7,444,567 B2 | * | 10/2008 | Wang et al. | 714/726 |
| 7,461,309 B2 | * | 12/2008 | Kiryu | 714/729 |
| 7,475,311 B2 | * | 1/2009 | Kiryu | 714/732 |
| 7,487,420 B2 | * | 2/2009 | Keller | 714/732 |
| 7,512,851 B2 | * | 3/2009 | Wang et al. | 714/726 |
| 7,596,733 B2 | * | 9/2009 | Kapur et al. | 714/726 |
| 7,610,527 B2 | * | 10/2009 | Wang et al. | 714/724 |
| 7,640,468 B2 | * | 12/2009 | Linam et al. | 714/724 |
| 7,840,861 B2 | * | 11/2010 | Sul | 714/726 |

* cited by examiner

*Primary Examiner* — James C Kerveros

(57) ABSTRACT

A system including a first clock, a first scan chain, and a first sampling circuit. The first clock is configured to generate a first clock signal. The first scan chain includes a first input, a first set of devices, and a first output. The first input is configured to receive a portion of first data to test the first scan chain. The first set of devices has a first plurality of states, wherein each of the first set of devices changes between the first plurality of states in response to the portion of the first data. The first output is configured to output a portion of second data in response to the first plurality of states. The first sampling circuit is configured to sample the portion of the second data from the first output at least twice per clock cycle of the first clock signal.

22 Claims, 17 Drawing Sheets

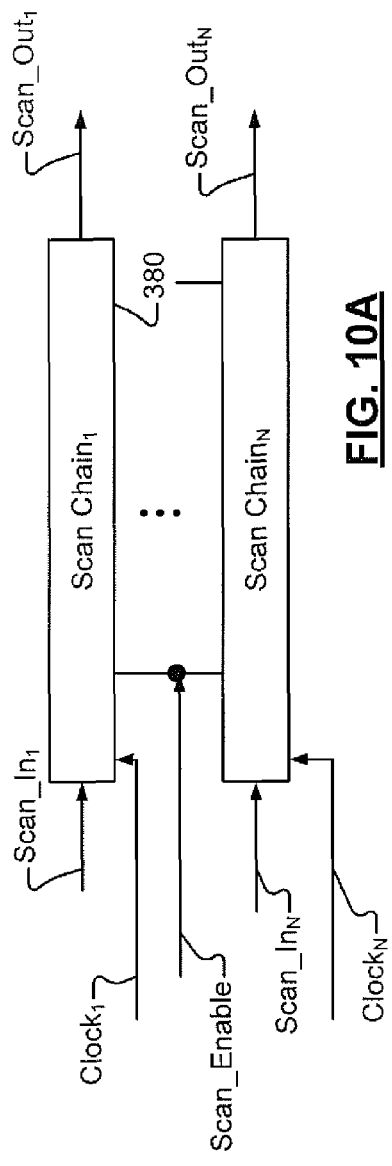
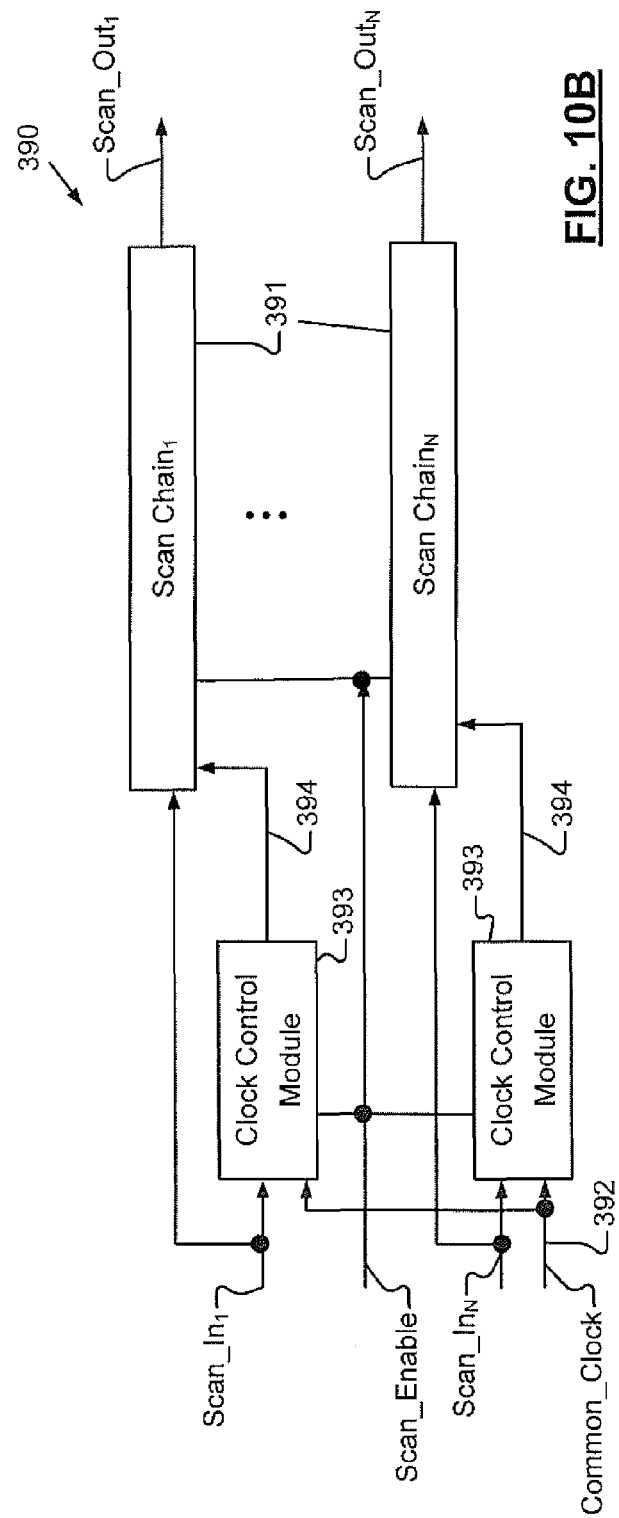

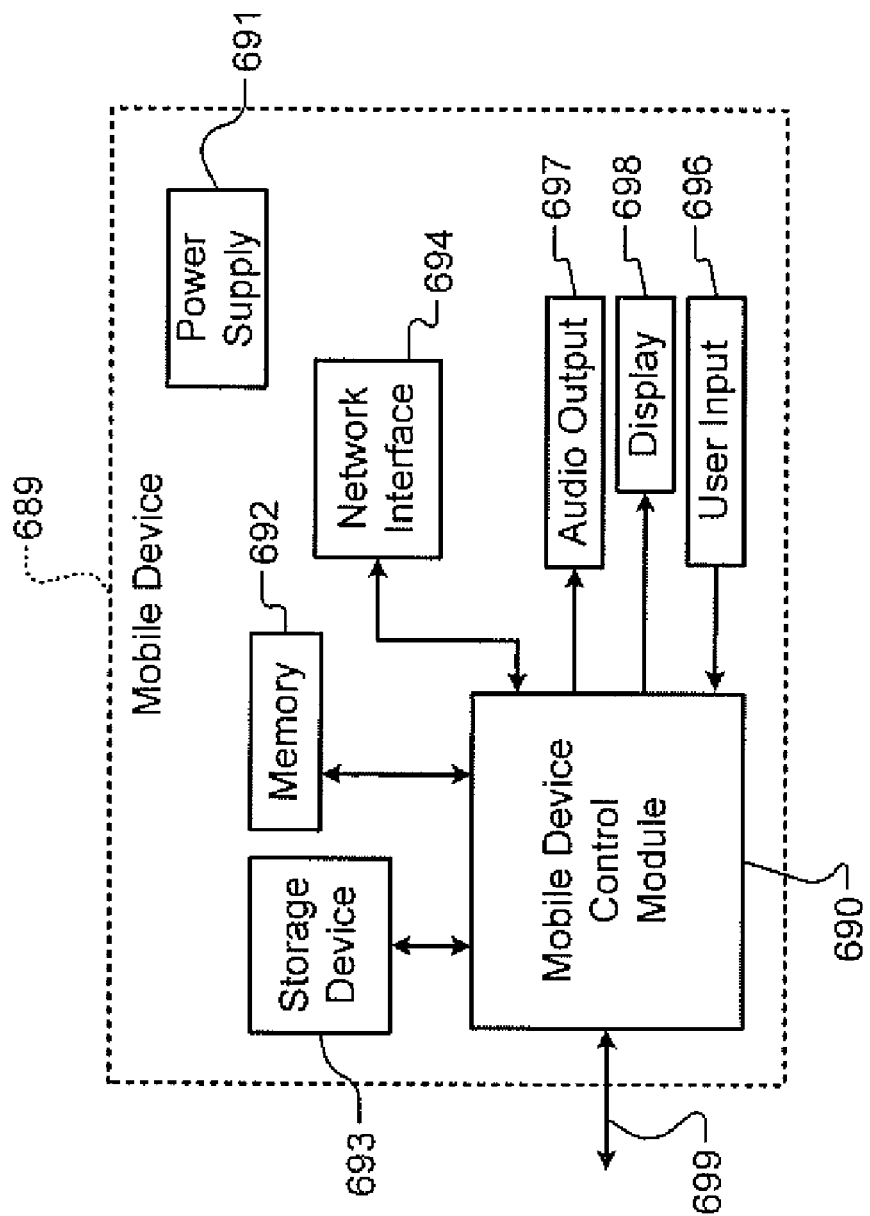

SCAN TESTING SYSTEM AND METHOD

CROSS-REFERENCE TO RELATED APPLICATIONS

This application is a continuation of U.S. application Ser. No. 11/982,937, now U.S. Pat. No. 8,024,631, filed on Nov. 6, 2007, which claims priority under 35 U.S.C. §119(e) to U.S. Provisional Application No. 60/864,655, filed on Nov. 7, 2006, the disclosures of the above applications are incorporated herein by reference in their entirety.

FIELD

The present disclosure relates to integrated circuits, and more particularly to testing integrated circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Scan-based testing is a technique that is used to internally test elements of a circuit under test (CUT), such as an application specific integrated circuit (ASIC). The testing may be performed to monitor operation of state variable devices (i.e. flip-flops and/or latches) and to detect core faults within the CUT. Scan-based testing includes replacing state variable devices that make up sequential circuits with pseudo inputs and outputs. Values of the pseudo inputs and outputs can be set arbitrarily and monitored by connecting memory elements and/or sequential logic devices of the CUT in a serial shift register configuration.

Each serial shift register is referred to as a scan chain. Serial shift (i.e. scan) actions are employed to set flip-flops of the CUT to an arbitrary set of values. Scan test data is shifted into the CUT, and resultant output test data is captured, sampled and monitored. This process transforms a sequential circuit into a virtual combinational circuit where scan in and out activities are defined as macro operations to set and monitor the state variables of the CUT.

Serial scanning becomes infeasible with increased circuit complexity and thus an increased number of state variables. For this reason, parallel scanning is implemented. In parallel scanning an overall scan chain is separated into a number of independently operable serial scan chains to reduce overhead. For example, a 100,000-bit serial scan chain may be implemented as 10 independently operable scan chains of 10,000 bits each. This implementation reduces the total number of shift cycles necessary to load and unload the 100,000 bits by a factor of 10.

Referring now to FIG. 1, a functional block diagram of a CUT 10 is shown. The CUT 10 includes scan chains 12, which are in parallel and have associated combinational logic circuits 14. The combinational logic circuits 14 communicate with and are positioned between the scan chains 12. The CUT 10 also includes multiple Scan_In and Scan_Out tester pins 16, 18. A pair of Scan_In and Scan_Out pins is associated with each of the scan chains 12. Scan test data, which may be controlled, is provided to the Scan_In pins 16. Output of the scan chains 12 may be monitored via the Scan_Out pins 18.

Parallel scanning may be limited to the number of independently operable scan chains that can be implemented on an integrated circuit (IC), but parallel scanning may also reduce the number of shift cycles of a scan-based test. Each independent scan chain may require a pair of Scan_In/Scan_Out pins that are directly accessible using primary I/O pins of the IC. The number of I/O pins available for scan testing purposes may be limited.

As integrated circuit devices grow in size, corresponding scan chains also grow in size. With an increase in scan chain size comes an increase in the number of shifts required to load and unload data. Also, the larger the scan chains, the more data that is required from and used by a test system, which may increase memory requirements to perform a test.

In addition, during scan testing automatic test pattern generation (ATPG) vectors are generated. For each ATPG vector, an input vector, an expected output vector, and a mask vector may be needed to indicate whether a test output bit value is reliable. Thus, a substantial amount of high-speed memory may be required to store test patterns and expected results. The total volume of test related data and the need for increased physical bandwidth (i.e. number of externally controllable parallel scan chains) are dominant factors in determining overall test cost for complex ICs.

As a result, data decompression and compression techniques are used to reduce the number of needed Scan_In/Scan_Out pins. A decompressor and a compressor may be provided on a CUT. As an example, scan test data may be provided to Scan_In pins, decompressed, and then provided to scan chains. Compressors may compress output signals of the scan chains and provided the output signals to Scan_Out pins. Put another way, a seed value may be scanned into a decompressor. The decompressor may then produce actual test values, which are fed into the scan chains. More scan chains are thus used with larger amounts of scan test data, which tends to shorten scan chain length. Reduced scan chain length may reduce test system memory requirements and test time.

Compression algorithms can be adversely affected by a high X-density. During scan testing, unknown data can occur. Unknown data is represented as an X. Unknown data is generated external to scan chains and can cause monitored data and faults to be masked. The term "mask" refers to the inability to monitor and reliably use certain discarded or hidden data.

Data may be unreliable when proper values of certain pin(s) are unknown, which can result from the reception of one or more Xs. Xs may be generated during a scan test from uncontrollable devices that have unknown outputs. Unknown outputs may be associated with, for example, random access memory (RAM)s, phase lock loops (PLL)s, delay lock loops (DLL)s, analog devices, embedded blocks, and/or other devices. A low level compression ratio of the associated compressor may provide variable test data results when a CUT experiences a high number of Xs during scan testing.

X-density of a CUT is based on the number of X's that occur during a load and unload of data. More particularly, X-density may equal the number of X's divided by the number of shifts that occur during a load and unload process. As an example, a CUT may experience 100 Xs and 1000 shifts for a single capture event. Thus, the CUT has an X-density of 0.1 Xs per shift. When the compression ratio is increased by ten (10) such that there are 100 shifts, the X-density is 1.0 Xs per shift. An X-density of 1.0 Xs per shift may render the compression output data useless.

SUMMARY

In general, in one aspect, this specification discloses a system including a first clock, a first scan chain, and a first sampling circuit. The first clock is configured to generate a first clock signal. The first scan chain includes a first input, a first set of devices, and a first output. The first input is configured to receive a portion of first data to test the first scan chain. The first set of devices has a first plurality of states, wherein each of the first set of devices changes between the first plurality of states in response to the portion of the first data. The first output is configured to output a portion of second data in response to the first plurality of states. The first sampling circuit is configured to sample the portion of the second data from the first output at least twice per clock cycle of the first clock signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 10A is a functional block diagram of a parallel configuration of scan chains illustrating reception of different clock signals;

FIG. 10B is a functional block diagram of a clock control circuit;

FIG. 13G is a functional block diagram of a mobile device.

DETAILED DESCRIPTION

Figure 1:
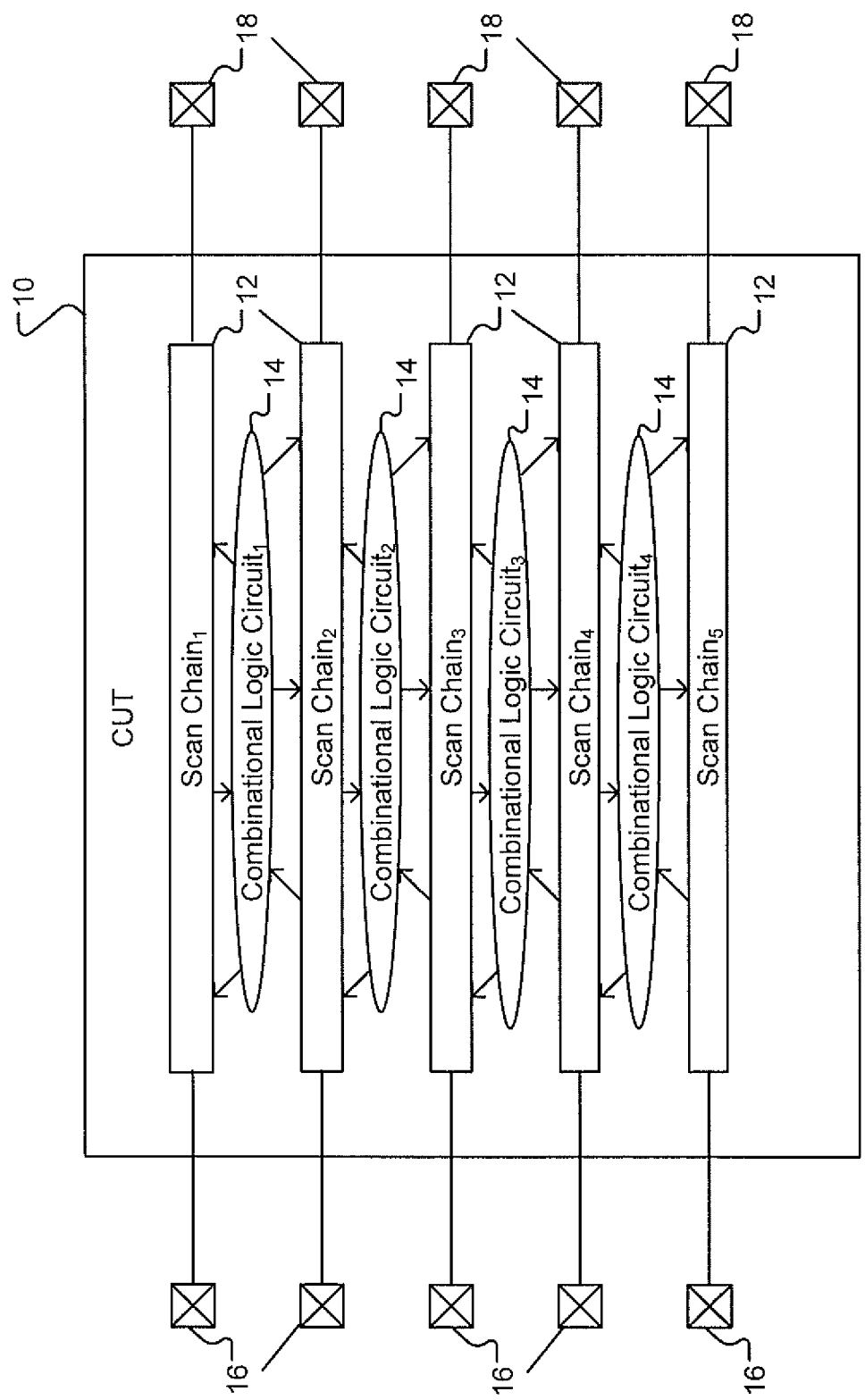
FIG. 1 is a functional block diagram of a circuit under test (CUT) that includes a traditional parallel scan chain configuration.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

The below described embodiments provide different techniques that may be used separately or in combination to increase compression ratio while not increasing or only marginally increasing X-density of a circuit under test (CUT). A CUT may be an IC, an ASIC, or other circuit.

Figure 2:
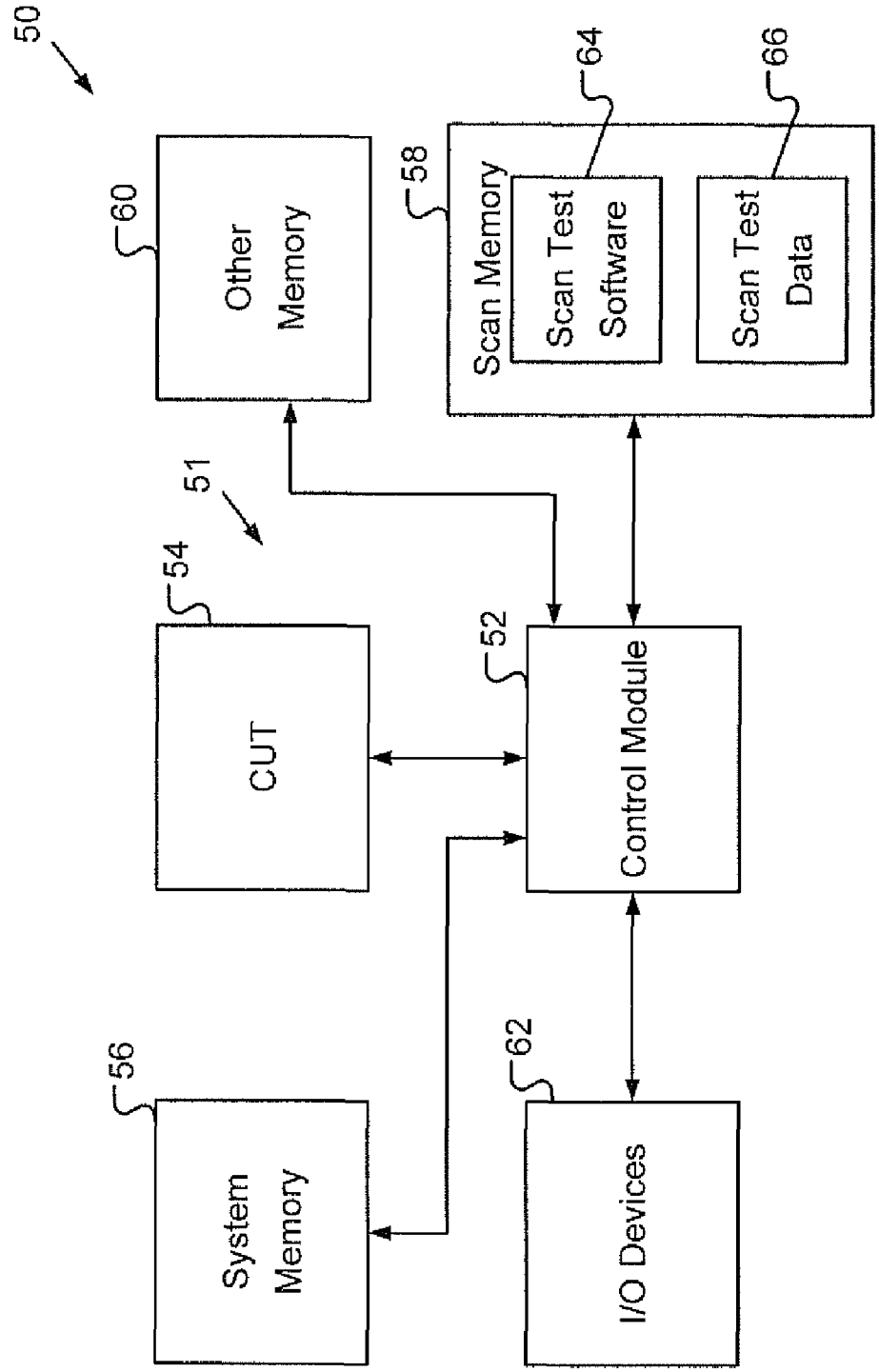
FIG. 2 is a functional block diagram of a scan-based testing system.

Referring now to FIG. 2, a functional block diagram of a scan-based testing system 50 is shown. The scan-based testing system 50 includes a scan test circuit 51 that has a control module 52 that communicates with a CUT 54. The scan-based testing system 50 may also include system memory 56, scan memory 58, other memory 60 and input/output (I/O) devices 62. The system memory 56 may include operating system software. The scan memory 58 may include scan test software 64 and scan test data 66. The I/O devices 62 may include a keyboard, a mouse, a trackball, a printer, a display, a network connection, etc.

Portions of the embodiments of the present disclosure may be implemented in software instructions, which may be stored in the system memory 56, the scan memory 58 and/or the other memory 60. The memories 56, 58, 60 may include a hard disk drive, random access memory (RAM), read only memory (ROM), flash memory, or other memory. The software instructions may also be stored in removable or remote media, such as memory cards, compact disks, floppy disks, etc. that may communicate with one of the I/O devices 62. The software instructions may also be received from and/or transmitted to a computer system via one of the I/O devices 62.

Figure 3:
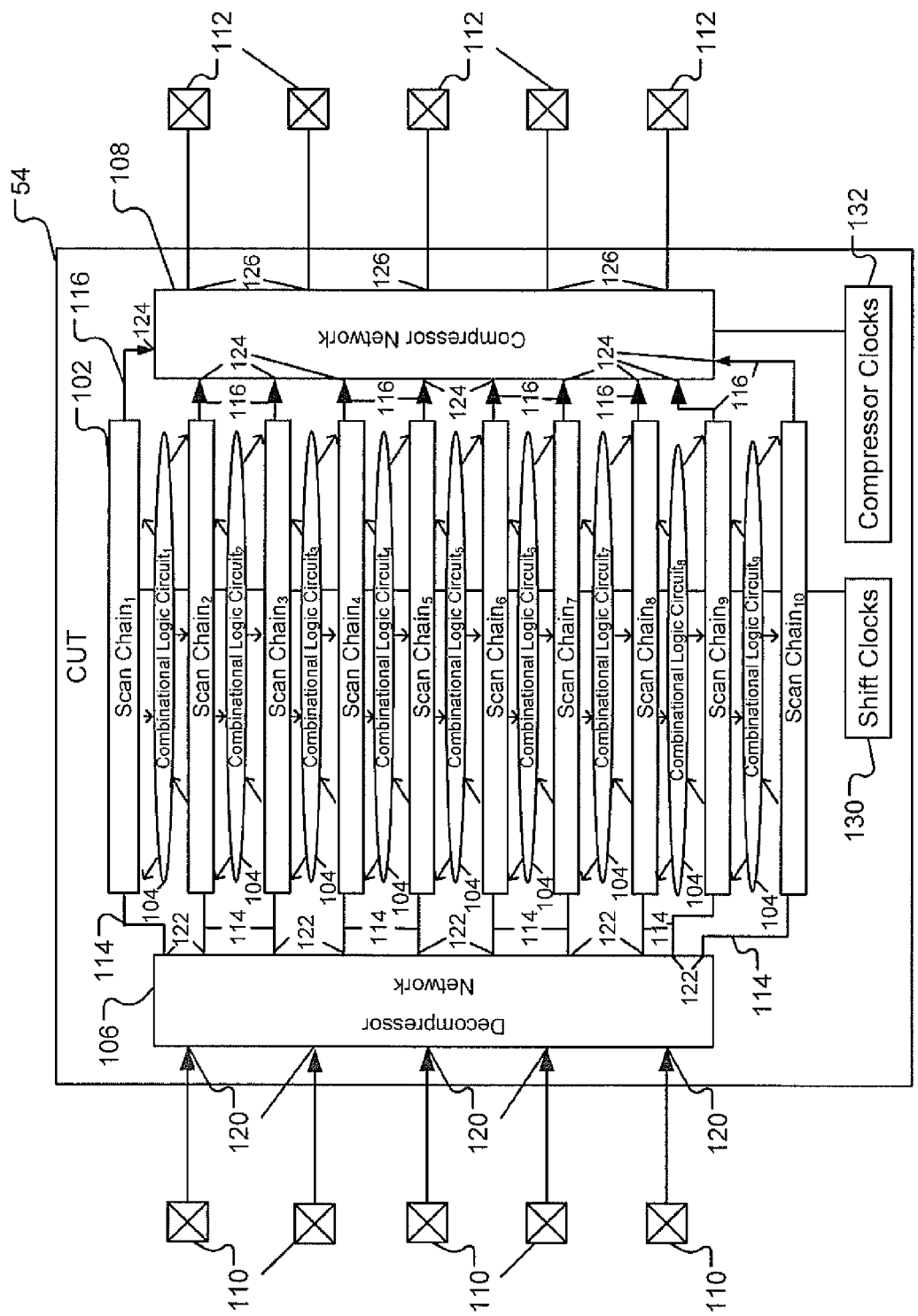
FIG. 3 is a functional block diagram of a CUT that includes a scan chain configuration.

Referring now to FIG. 3, a functional block diagram of a CUT 54 includes a scan chain configuration that has a parallel decompress/compress structure. The CUT 54 includes parallel configured scan chains 102, which have associated combinational logic circuits 104. The combinational logic circuits 104 communicate with and are positioned between the scan chains 102. The CUT 54 also includes a decompressor network 106, a compressor network 108 and multiple scan input (Scan_In) and scan output (Scan_Out) tester pins 110, 112. The pins 110, 112 may be referred to as inputs and outputs, respectively. The decompressor network 106 decompresses data from the Scan_In pins 110 to provide scan chain input signals 114. The compressor network 108 compresses scan chain output signals 116 prior to reception by the Scan_Out pins 112. Scan test data, which may be referred to as control data, is provided to the Scan_In pins 110. Output of the scan chains 102 is monitored in a compressed format via the Scan_Out pins 112.

The scan chains 102 may include state variable devices, such as flip-flops, and/or other state variable devices. The combinational logic circuits 104 may include any number and combination of logic gates.

For the example shown, the CUT 54 includes five (5) Scan_In pins and 5 Scan_Out pins. The decompressor network 106 has a corresponding input/output ratio of 1:2. The compressor network 108 has a corresponding input/output ratio of 2:1. Thus, the CUT 54 includes ten (10) scan chain inputs and 10 scan chain outputs. The decompressor and compressor networks 106, 108 may have any associated decompression and compression ratios.

In the example shown, the decompressor network 106 has five decompressor inputs 120 and ten decompressor outputs 122. The decompressor network 106 may be based on a linear feedback shift register (LFSR) network and include exclusive-OR gates (XOR). The decompressor 106 may operate in multiple modes including pseudorandom and deterministic modes. In the pseudorandom mode, a pseudorandom pattern generator (PRPG) (not shown) may be used to generate test vectors. In the deterministic mode, variable-length seeds (not shown) may be serially scanned through a boundary-scan interface into the PRPG and parts of internal scan chains. Subsequently, a decompression may be performed in parallel via the PRPG and selected scan flip-flops that may be interconnected to form a decompression device.

In the example shown, the compressor network 108 has ten compressor inputs 124 and five compressor outputs 126. The compressor network 108 may include logic devices, capture devices, latch devices, sampling devices, and other devices. An exemplary compressor network 108 may include a network of XOR gates for compression, as well as flip-flops and latches to sample the scan chain output signals.

The CUT 54 may also include shift clocks 130 and compressor clocks 132, which may be synchronized with the shift clocks 130. The shift clocks 130 are used to coordinate shifting of data in and out of the scan chains 102. The compressor clock 132 may be used to capture data from the scan chains 102.

Figure 4:
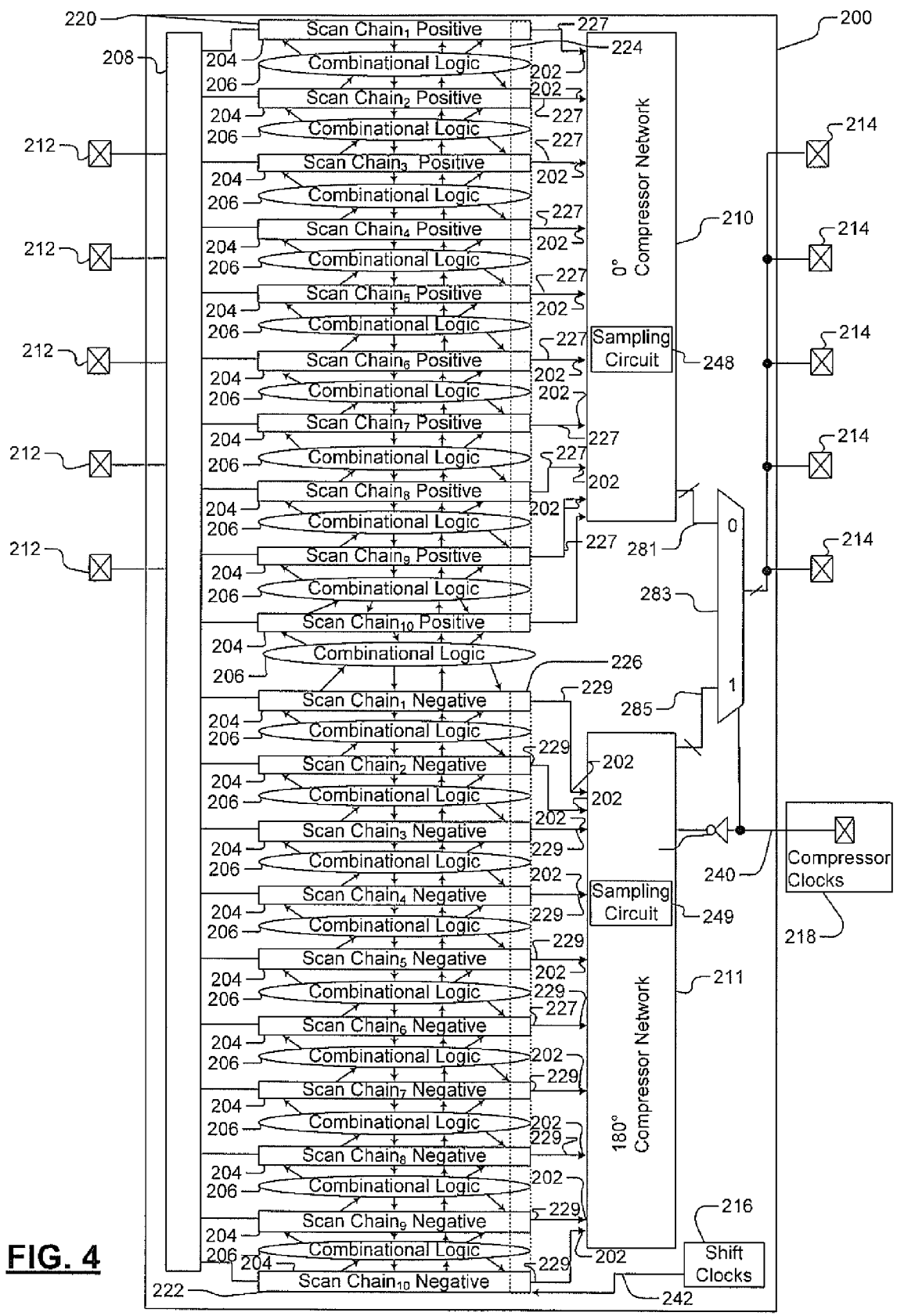
FIG. 4 is a functional block diagram of a CUT that includes a scan chain configuration in accordance with the present disclosure.

Referring now to FIG. 4, an exemplary CUT 200 includes shifted scan chain output signals 202. The CUT 200 also includes multiple parallel configured scan chains 204. As with the scan chains 102, the scan chains 204 have associated combinational logic circuits 206. The combinational logic circuits 206 communicate with and are positioned between the scan chains 204. The CUT 200 also includes a decompressor network 208, two compressor networks 210, 211, and multiple scan input (Scan_In) and scan output (Scan_Out) tester pins 212, 214. The CUT 200 may also include one or more shift clocks 216 and one or more compressor clocks 218.

The scan chains 204 include a first set of scan chains 220 and a second set of scan chains 222. The last state variable device within each of the scan chains of the first set of scan chains 220 may be a positive sequential element that is designated by dashed box 224. A positive sequential element refers to an element that responds to a rising edge of a clock signal. When a positive sequential element is not available for use as a last state variable device, a positive edge lock-up latch or a lock-up flip-flop may be used. The lock-up elements affect scan shifting of data and do not affect functionality of the CUT.

The last state variable device within each of the scan chains of the second set of scan chains 222 may be a negative sequential element that is designated by dashed box 226. A negative sequential element refers to an element that responds to a falling edge of a clock signal. When a negative sequential element is not available for use as a last state variable device, a negative edge lock-up latch, or lock-up flip-flop may be used.

When the scan chains 204 are configured to respond based on a common shift or compressor clock signal, scan chain output signals 229 of the second set of scan chains 222 are offset in time from scan chain output signals 227 of the first set of scan chains 220. Thus, data from the second set of scan chains 222 is staggered and/or overlaps data from the first set of scan chains 220 in time. The term overlap refers to portions of two or more separate signals or signal pulses that exist at the same time. The compressor clock signals may be the same as the shift clock signals. Further, the compressor networks 210, 211 may operate based off of the shift clock signals 242 and not the compressor clock signals 240

Although two sets of scan chains are shown in FIG. 4, any number of scan chain sets may be incorporated. Also, each scan chain set may have any number of scan chains.

Each of the compressor networks 210, 211 may include sampling circuits 248, 249 that receive and sample the scan chain output signals 202. The sampling circuits 248, 249 may oversample, or in other words, sample each of the scan chain output signals 202 at least twice per clock cycle, Oversampling may result in a data sampling ratio of greater than or equal to 2:1. Examples of 2s (sampling twice per clock cycle) and 4s (sampling four times per clock cycle) sampling rate implementations are shown in the timing diagrams of FIGS. 6 and 8.

The combination of the scan chain output signals 202 being offset in time and the oversampling of the scan chain output signals 202 allows for data to be captured, latched, and monitored that may have otherwise been masked and/or rendered useless.

Figure 5:
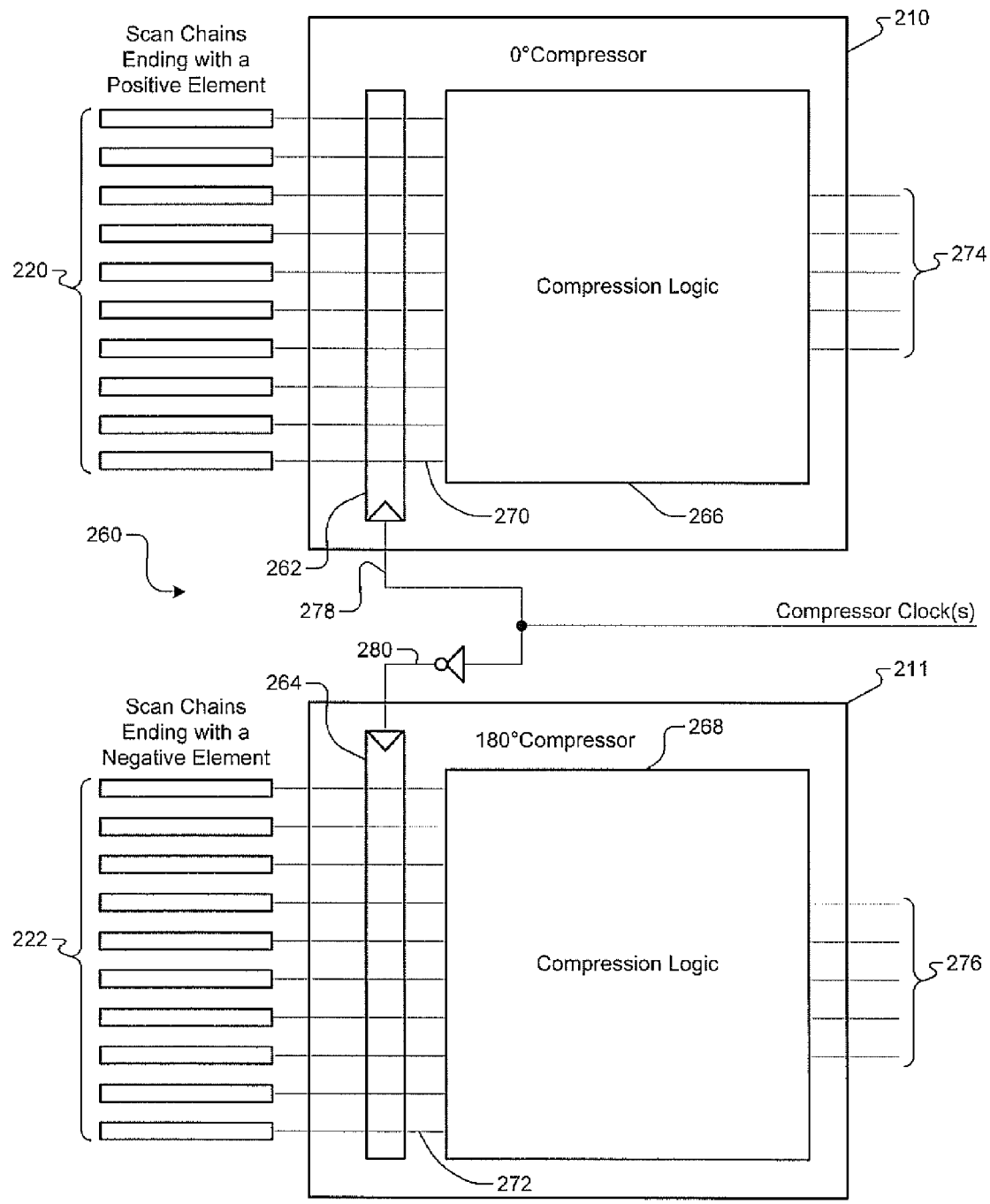
FIG. 5 is a functional block diagram of a compressor circuit portion of a CUT in accordance with the present disclosure.

Referring now to FIG. 5, a functional block diagram of a compressor circuit portion 260 of a CUT for a parallel scan chain configuration is shown. The embodiment of FIG. 5 is directed to a 2s sample rate configuration, but may be modified for other sample rates. Each of the compressor networks 210, 211 includes a set of flip-flops 262, 264. The flip-flops 262, 264 communicate with scan chains 220, 222 that end in respective positive or negative elements. Flip-flops 262, 264 may receive compressor clock signals 278 and inverted compressor clock signals 280, respectively.

Compressor logic circuits 266, 268 receive outputs 270, 272 of the flip-flops 262, 264. Each of the compressor logic circuits 266, 268 may have one or more output tester pins 274, 276. The compressor networks 210, 211 may each have a compression ratio of 2:1 or some other compression ratio.

Figure 6:
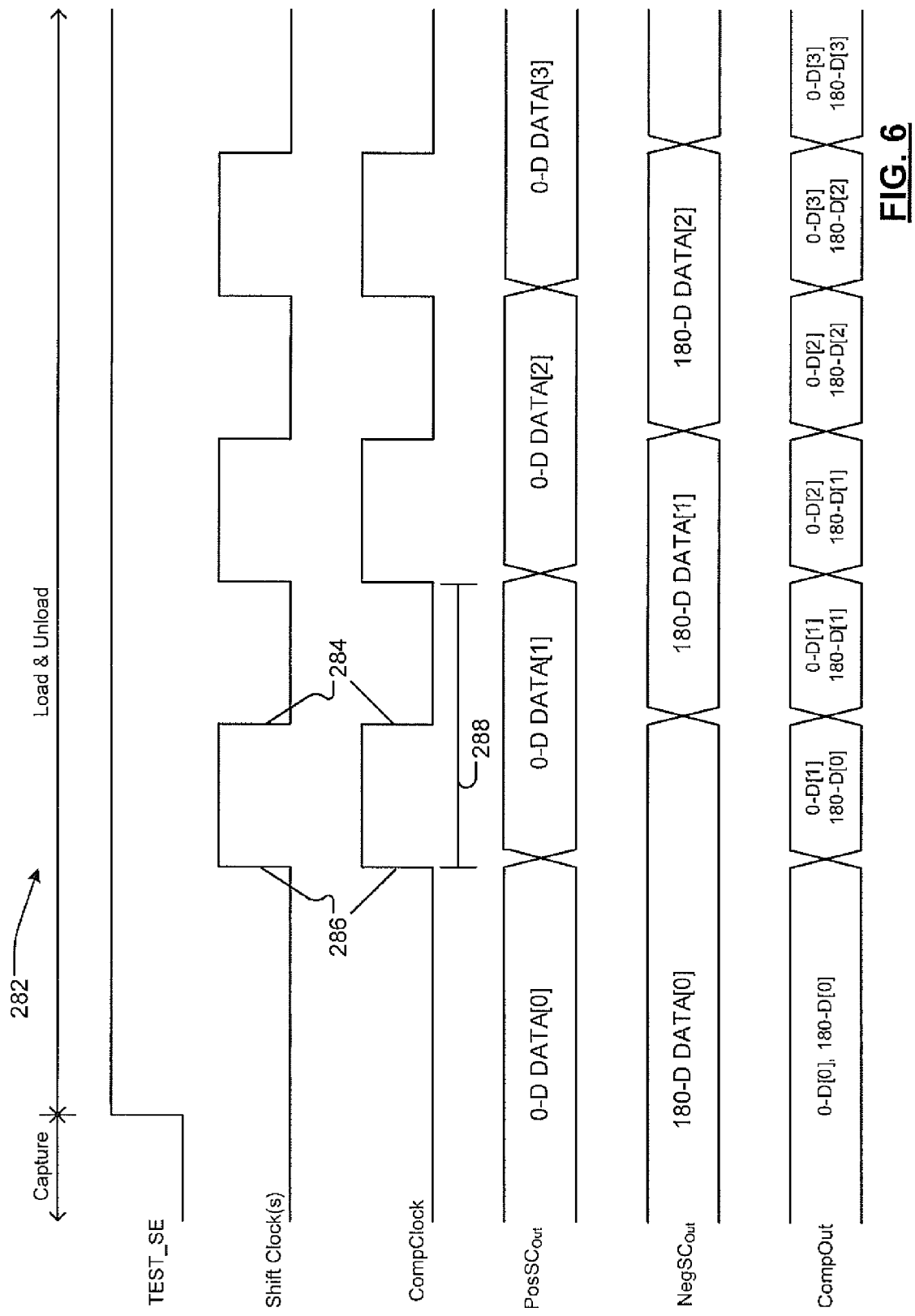
FIG. 6 is a sample timing diagram illustrating overlapping and increased sampling of scan chain data output signals in accordance with the present disclosure.

Referring now to FIG. 6, a sample timing diagram 282 illustrates overlapping and increased sampling of scan chain data output signals. The overlapping and increased sampling of scan chain data output signals may provide an increased amount of data samples, which effectively reduces X-density associated with a CUT.

X-density refers to a number of unknown data samples divided by a number of shifts that occur during a load and unload sequence of scan chains. As an example, using the (1s) configuration of FIG. 3, when there is an average of Xs in a CUT of 100, with 1000 shifts during a load and unload sequence, the X-density may be 0.1 for the associated compressor network. With the multiple sample (2s) compressor scheme of FIG. 4, the number of chains may be doubled. As a result, the number of shift cycles may be 500. As a result, the X-density of each compressor may be 50/500, or 0.1.

A first input 281 of a multiplexer 283 receives the outputs of the first compressor network 210. A second input 285 of the multiplexer 283 receives the outputs of the second compressor network 211. The multiplexer may be a 2:1 multiplexer, a 4:1 multiplexer, etc. The compressor clock(s) 218 may control a select line(s) of the multiplexer 283. The first compressor network 210 may be referred to as 0° compressor and may be selected to the scan outputs when the compressor clock 218 is low. The second compressor network 211 may be referred to as a 180° compressor and may be selected to the scan outputs 214 when the compressor clock 218 is high, and vice versa.

The timing diagram of FIG. 6 includes a test enable signal TEST_SE, shift clock signals Shift Clock(s), a compressor clock signal CompClock, a positive edge scan chain signal PosSC$_{Out}$, a negative edge scan chain signal NegSC$_{Out}$, and a compressed signal CompOut. The test enable signal TEST_SE may be provided by the control module 52 of FIG. 2. The shift clock signals Shift Clock(s) may be provided by the shift clocks 216. The compressor clock signal Comp-Clock may be provided by the compressor clocks 218. The positive edge scan chain signal PosSC$_{Out}$ may be provided by the first set of scan chains 220. The negative edge scan chain signal NegSC$_{Out}$ may be provided by the second set of scan chains 222. The compressed signal CompOut represents output test data signals on the output tester pins 214. Each of the positive edge scan chain signal PosSC$_{Out}$, the negative edge scan chain signal NegSC$_{Out}$ and the compressor signal CompOut include five bit samples of data; one from each of the corresponding scan chain output signals 202 or output tester pins 214.

Note that for the embodiment shown, there are two data set samples for the duration of each data set. For example, data set samples 0°[1]/180°[0] and 0°[1]/180°[1] are gathered during the duration of data set 0° DATA[1]. Thus, should there be an X (unknown) associated with the data set 180° DATA[0] when one or more of the clock signals Shift Clock(s), CompClock are high, the data set 0° DATA[1] may be sampled upon falling edges 284 of one or more of the clock signals, as designated by data set sample 0°[1]/180°[1]. This allows for faults or proper data to be detected that would otherwise be masked.

When entering a load and unload phase, the shift and compressor clocks 216, 218 are in an OFF state, such as a logic 0. The compressor network 210 outputs data from the first and second set of scan chains 220, 222, represented by signals PosSC$_{Out}$, NegSC$_{Out}$, respectively. Output of the first and second set of scan chains 220, 222 during the initial OFF state is provided by data sets 0° DATA[0] and 180° DATA[0]. A first sample of the output tester pins 214 is taken, which includes data set samples 0°[0] and 180°[0].

The shift and compressor clock signals 242, 240 may then switch to an active state, such as transitioning from a LOW state to a HIGH state. This transition is shown by rising edges 286, which changes output data on the first set of scan chains 220. Another sample is then taken, which includes data set samples 0°[1] and 180°[0]. The two samples of data are thus taken during one clock cycle. Since the two samples are gathered in one clock cycle, test time may not be increased.

A clock cycle refers to a single cycle of transition states of a clock signal. As a square wave, a clock cycle generally includes a single rising edge, a single falling edge, a single HIGH state and a single LOW state. An example of a clock cycle is designated 288.

With two compressors, X-density may remain constant. For the configuration of FIG. 4, the Xs may be split between the first and second sets of scan chains 220, 222. This split may be even such that when there are 100 Xs, 50Xs may be provided to the first set of scan chains 220 and the other 50Xs may be provided to the second set of scan chains 222. The number of chains is doubled, for example 10 to 20; and the number of shift cycles is 500. Thus, the X-density of the compressor network 210 may be 50/500, or 0.1. The X-density may be similar to the 1s configuration of FIG. 3. Note that the Xs may not be evenly split, and the X-density can be different for the first and second sets of scan chains 220, 222. Nevertheless, distribution of the Xs may be managed by stitching a chain to balance the X's between the first and second compressor networks 210, 211.

As another 2s sample rate example, a 0° shift clock and an inversion of that shift clock, a 180° shift clock, may be used. The two shift clock signals may be provided to two different sets of parallel scan chains. The two sets of scan chains may both respond to either rising or to falling edges of a clock signal. The 0° shift clock signal may be provided to a first set of scan chains and the 180° shift clock signal may be provided to a second set of scan chains. Thus, scan chain output signals are shifted due to reception of two different clock signals, as opposed to use of positive and negative state variables.

In the above examples, 2s sampling rates are used. Other sampling rates may be used such as 4s, 8s, 16s, etc. For a sampling rate above 2s, additional clock signals may be generated to collect additional samples. The additional clock signals may be generated internal or external to a CUT. The additional clock signals may also be skewed or have different phases.

Figure 7:
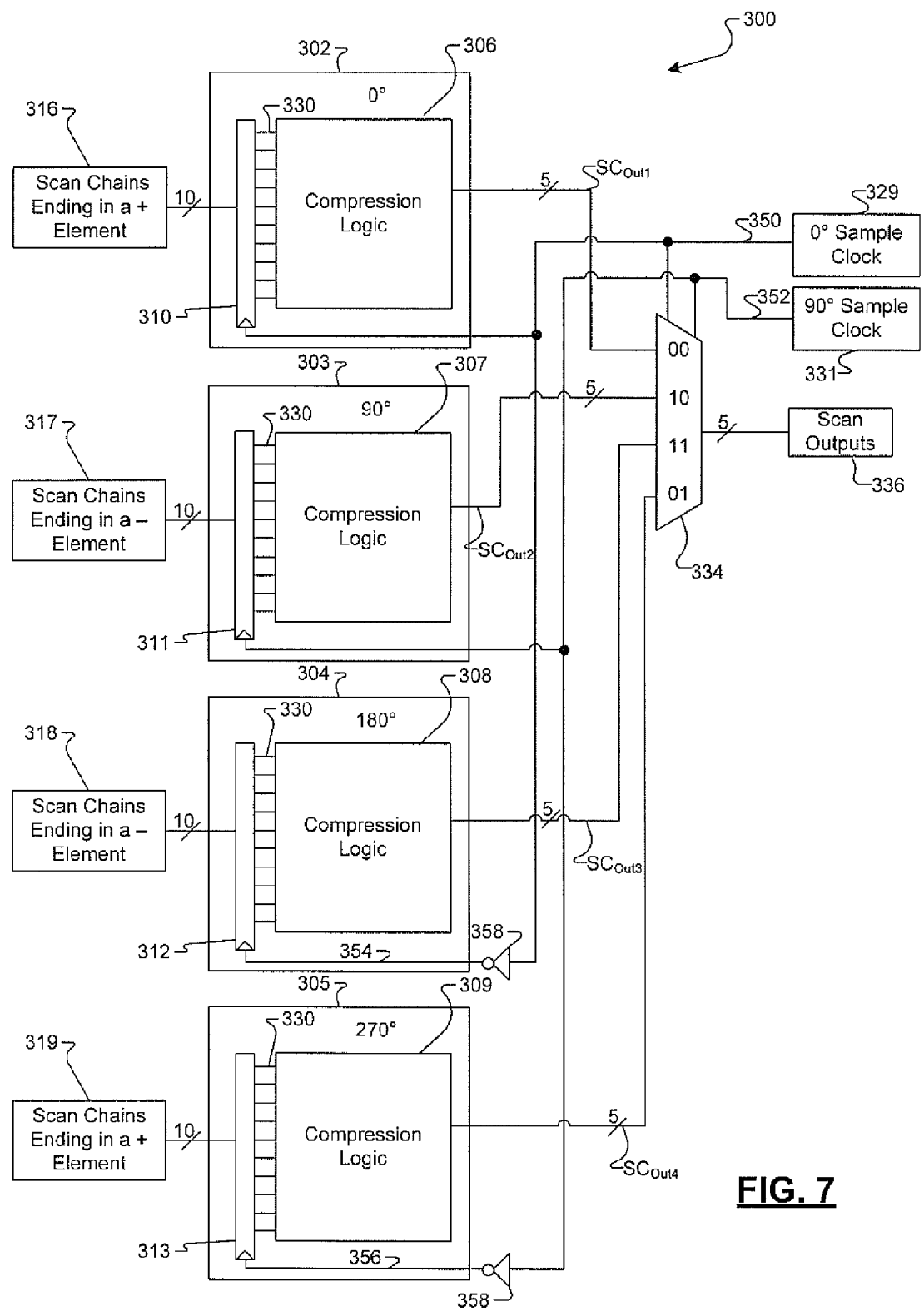
FIG. 7 is a functional block diagram of another compressor circuit portion of a CUT for a parallel scan chain configuration in accordance with the present disclosure.

Referring now to FIG. 7, a functional block diagram of a compressor circuit portion 300 of a CUT for a parallel scan chain configuration is shown. The embodiment of FIG. 6 is directed to a 4s sample rate configuration, but may be modified for other sample rates. The compressor circuit portion 300 includes four exemplary compressor networks 302-305. The compressor networks 302-305 include respective compressor logic circuits 306-309 that receive signals from respective sets of flip-flops 310-313.

The flip-flops 310-313 communicate in parallel and between four scan chains 316-319 and the compressor logic circuits 306-309. The compressor logic circuits 306-309 may receive outputs 330 of the flip-flops 310-313. The multiplexer 334 may receive and select one of the outputs of the compressor logic circuits 306-309 at a time. The selection may be based on one or more sample clocks 329, 331 that may be out of phase by 90°.

Output tester pins 336 may receive multiplexer outputs. The compressor logic circuits 306-309 may each have a compression ratio of 2:1, as shown, or some other compression ratio.

The first set of flip-flops 310 communicates with scan chains 316 that end in a positive element. The second set of flip-flops 311 communicates with scan chains 317 that end in a negative element. The third set of flip-flops 312 communicates with scan chains 318 ending in a negative element. The fourth set of flip-flops 313 communicates with scan chains 319 ending in a positive element.

For a 4s sample rate, clocks 329, 331 may generate both a 0° clock signal 350 and a 90° clock signal 352, respectively. When more then one shift clock is used, then a first shift clock can provide the 0° clock signal, and a second shift clock can provide the 90° clock signal. The inverse of the 0° clock signal and the 90° clock signal respectively provides a 180° clock signal 354 and a 270° clock signal 356, respectively. The 180° clock signal 354 and the 270° clock signal 356 may be generated via the use of inverters 358.

The 0° clock signal 350 and the 90° clock signal 352 may be generated internal or external to the CUT. The first set of flip-flops 310 may receive the 0° clock signal 350. The second set of flip-flops 311 may receive the 90° clock signal 352. The third set of flip-flops 312 may receive the 180° clock signal 354. The fourth set of flip-flops 313 may receive the 270° clock signal 356. The described clock signals and the generation thereof is provided as an example only, the clock signals may be generated using other techniques.

Figure 8:
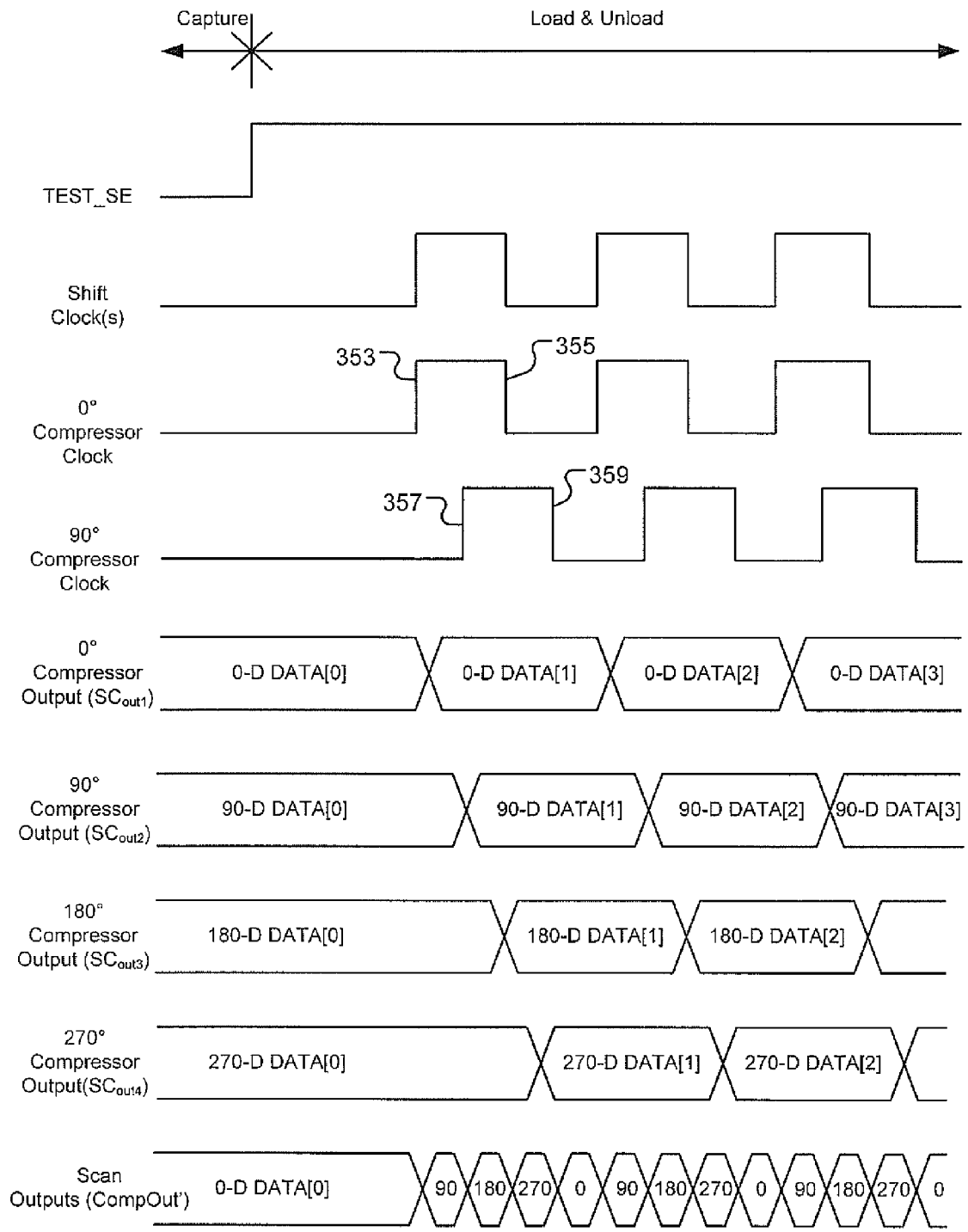
FIG. 8 is a sample timing diagram for the compressor circuit portion of FIG. 7 in accordance with the present disclosure.

Referring now to FIG. 8, a sample timing diagram for the compressor circuit portion 300 is shown. The timing diagram includes the test enable signal TEST_SE, the shift clock signals Shift Clock(s) and one or more compressor clock signals. The timing diagram illustrates the 0° sample clock signal 350 that includes rising and falling edges 353, 355, respectively, and the 90° sample clock signal 352 that includes rising and falling edges 357, 359, respectively. The timing diagram also includes scan chain output signals $SC_{Out1}$, $SC_{Out2}$, $SC_{Out3}$, $SC_{Out4}$ and a compressor signal CompOut. Note that each data set, such as data sets 0° DATA[1], 90° DATA[1], 180° DATA[1], and 270° DATA[1] may be sampled four times. Thus, should an X be associated with, for example one or more of the data sets 0° DATA[1], 90° DATA[1], 180° DATA [1], there are four chances that the data in the data set 270° DATA[1] is captured.

The 4s sample rate example may have the same X-density as compared with the above-described 1s example. The Xs for the 4s embodiment may be evenly split. Continuing from the above X-density example where 100Xs are generated in association with a CUT, the Xs may be provided to the scan chains 316-319. 25 Xs may be received by each of the four sets of flip-flops 310-313. Since the chains are quadrupled, for example from 10 to 40; and the number of shift cycles may be 250. Therefore the X-density of each compressor 302-305 may be 25/250, which is equal to 0.1, which is the same as with a single compressor. Again, note that the Xs may not be evenly split, and the X-density can be different for each compressor 302-305 and corresponding scan chains 316-319. Distribution of the Xs can be managed by stitching a chain to balance the X's between the compressors 302-305.

Figure 9:
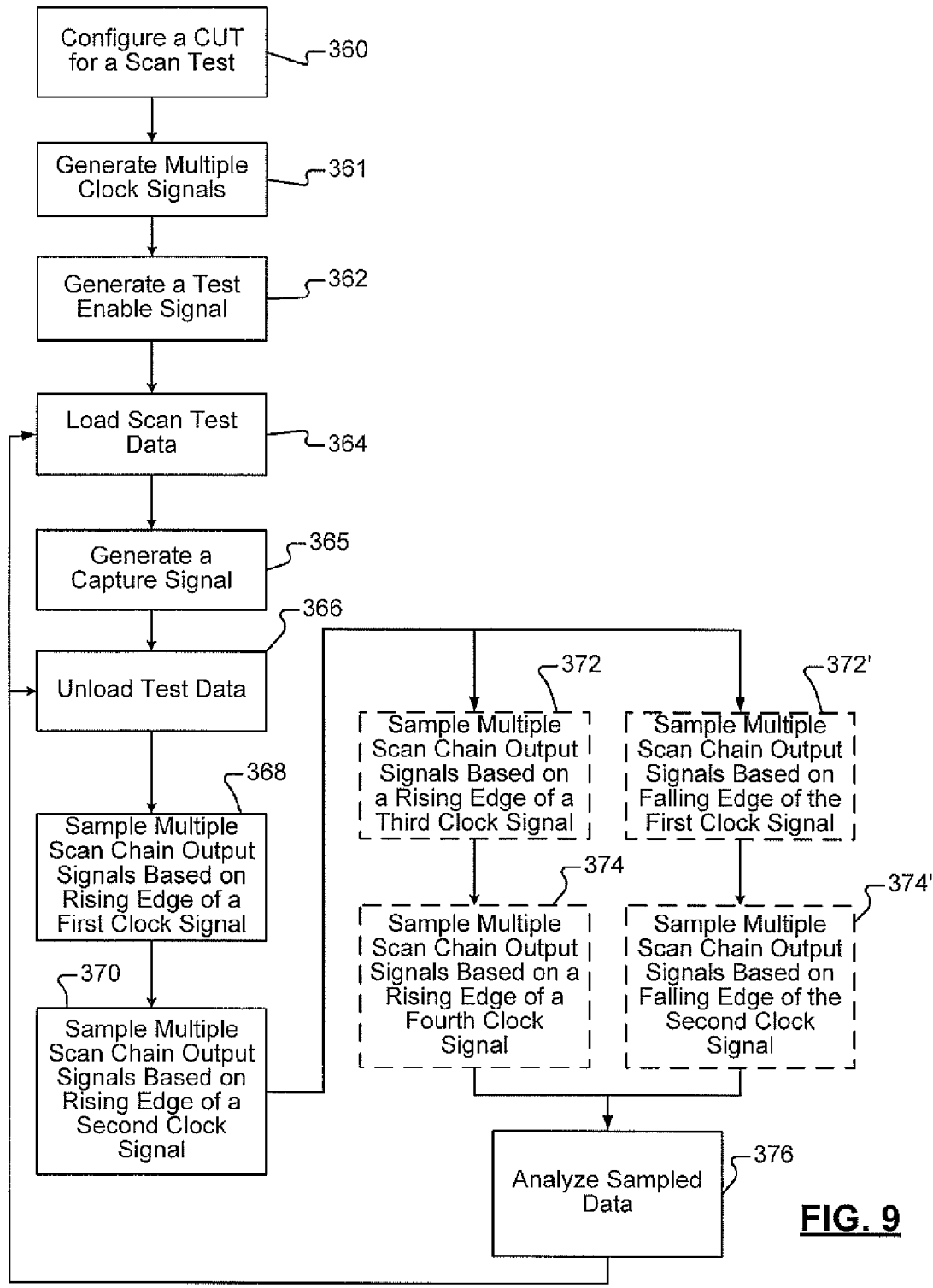
FIG. 9 is a flow diagram illustrating a method of performing a scan-based test in accordance with the present disclosure.

Referring now to FIG. 9, a flow diagram illustrating a method of performing a scan-based test in accordance with an embodiment of the present disclosure is shown.

In step 360, a CUT is configured for a scan test. State variable devices are set to form parallel scan chains. Automatic test pattern generation (ATPG) vectors may be generated including input, output and mask vectors. Test patterns are generated with knowledge of where Xs are generated. Thus, certain output tester pins of the CUT are masked for predetermined samples. Samples may not be taken for masked pins. Scan chains of the CUT may be grouped and have corresponding end state variable devices with positive or negative designations. The last state variable devices in a first set of scan chains may include positive sequential elements and the last stated variable devices in a second set of scan chains may include negative sequential elements.

In step 361, clock signals are generated. The clock signals may include shift clock signals and compressor clock signals. The compressor clock signals may have different phases. The different phased clock signals allow for simultaneous sampling of shifted and non-shifted scan chain output signals and/or sampling of different scan chains during different time intervals. Multiple sampling clock signals may be generated, such as the 0° sample clock signal 350 and the 90° sample clock signal 352, as well as the 180° clock signal 354 and the 270° clock signal 356.

In step 362, a test enable signal is generated. The test enable signal initiates a scan test. The test enable signal configures the state variable devices to allow for data shift in and out operations. In step 364, the CUT is operated in a first shift mode and scan test data is loaded into the scan chains. The scan test data may come from, for example, a scan memory, such as the scan memory 58.

In step 365, the CUT is operated in a functional mode and a capture signal is generated. Data at ends of the scan chains are captured. An associated multiplexer 334 may capture data. In step 366, the CUT is operated in a second shift mode and data in the state variable devices is shifted out for sampling. In step 368, upon the rising edge of a first clock signal, such as rising edge of the 0° clock signal, test output data may be sampled across each scan chain output signal. Data across the scan chain output signals $SC_{Out1}$, $SC_{Out2}$, $SC_{Out3}$, $SC_{Out4}$ is sampled, as designated by data set sample 0°[1], 90°[0], 180°[0], 270°[0].

In step 370, upon the rising edge of a second clock signal, such as rising edge of the 90° clock signal, test output data may be sampled across each scan chain output signal. The sampled data may be unmasked, although it may have been previously masked in step 368.

In step 372, upon the rising edge of a third clock signal, such as the 180° clock signal, or upon the falling edge of the first clock signal (designated step 372') test output data may be sampled across each scan chain output signal. The falling edge may be, for example, falling edge of the 0° clock signal. The sampled data may be unmasked, although it may have been previously masked in steps 368 and 370.

In step 374, upon the rising edge of a fourth clock signal, such as the 270° clock signal, or upon the falling edge of the second clock signal (designated step 374') test output data may be sampled across each scan chain output signal. Steps 364-374 and/or 366-374 may be continuously repeated. The sampled data may be unmasked, although it may have been previously masked in steps 368, 370, and 372. The tasks of steps 368-374 may be performed by a compressor network and/or a control module. In step 376, the sampled data may be analyzed to detect faults and determine CUT performance characteristics.

Referring now to FIG. 10A, a functional block diagram of a parallel configuration of scan chains 380 illustrating reception of different clock signals $Clock_1$-$Clock_N$ is shown. A separate clock signal is used for each of the scan chains 380. The clock signals $Clock_1$-$Clock_N$ are routed to achieve equal propagation delays from each clock source. Delays through separate clock networks are balanced in order minimize clock skew so that system performance (i.e. operating frequency) is maximized. Scan test data $Scan\_In_1$-$Scan\_In_N$ is provided to the scan chains 380. Output scan data $Scan\_Out_1$-$Scan\_Out_N$ is shifted out based on the cock signals $Clock_1$-$Clock_N$.

Referring now to FIG. 10B, a functional block diagram of a clock control circuit 390 with parallel configured scan chains 391 is shown. A common clock signal Common_Clock 392, such as a shift clock signal, is gated with an enable signal Scan_Enable via clock control modules 393. The clock control modules generate gated-clock signals 394. The gated-clock signals 394 are provided to flip-flops in each of the scan chains 391. The gated-clock signals 394 are also balanced to achieve equal propagational delays. Separate clock distribution networks may be used to provide the gated-clock signals 394 to the state variable devices in each of the scan chains 391.

Figure 11:
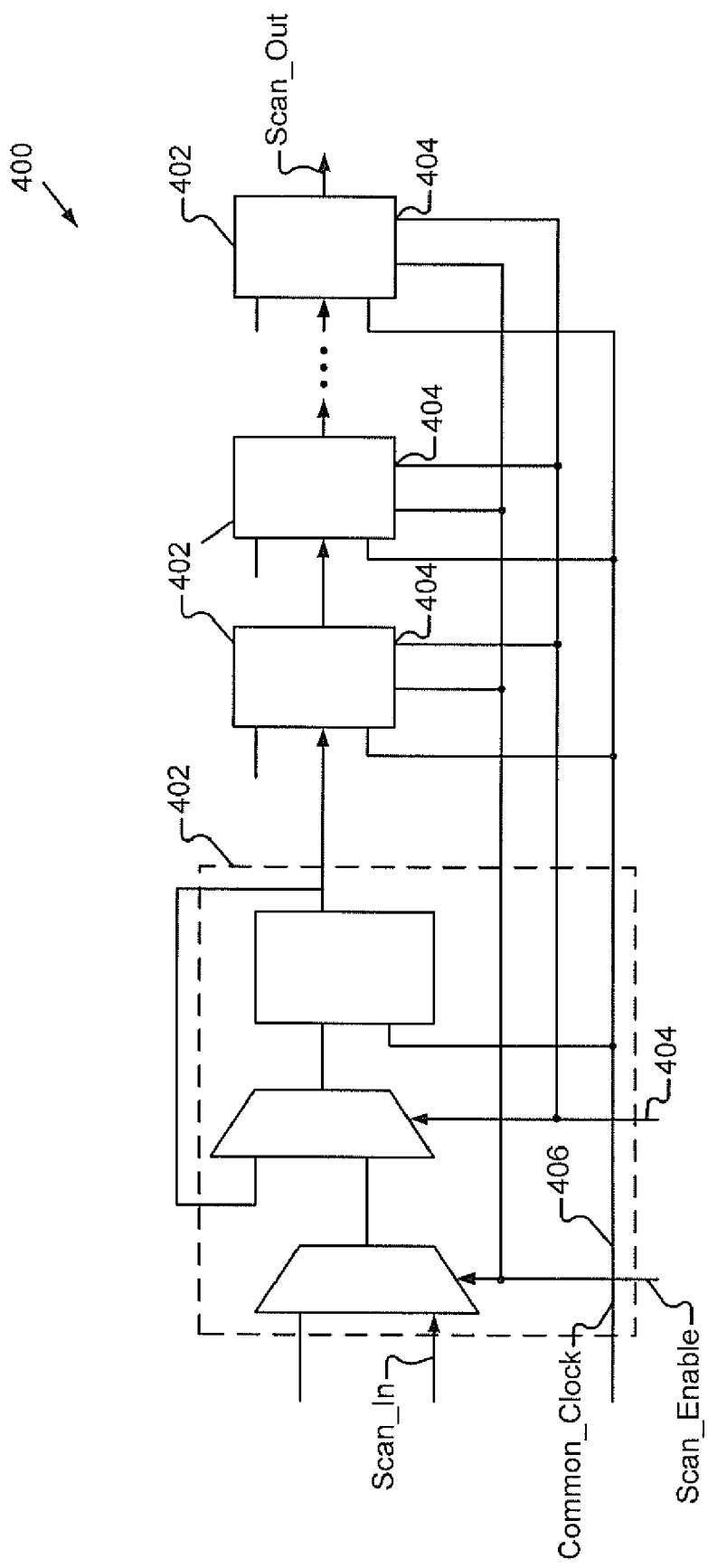
FIG. 11 is a functional block diagram of an example scan chain.

Referring now to FIG. 11, a functional block diagram of an example scan chain 400 is shown. The scan chain 400 may be included in the CUTs of FIGS. 3, 4, 10A and 10B and in other CUTs of the present disclosure. The scan chain 400 includes flip-flops 402 that each has an enable input 404 that receives an enable signal Scan_Enable to maintain a present-state of the flip-flops 402. A common clock signal Common_Clock 406 is provided to the flip-flops 402. The enable signal Scan_Enable is used to control behavior of each of the flip-flops 402. Present states of the flip-flops 402 are re-circulated, when the scan chain 400 is not enabled, and new data is admitted into the flip-flops 402, when the scan chain 400 is enabled. The delay through enable networks may be minimized and different enable signals may be balanced with each other in order to allow operation of the scan chain 400 at increased speeds.

Figure 12:
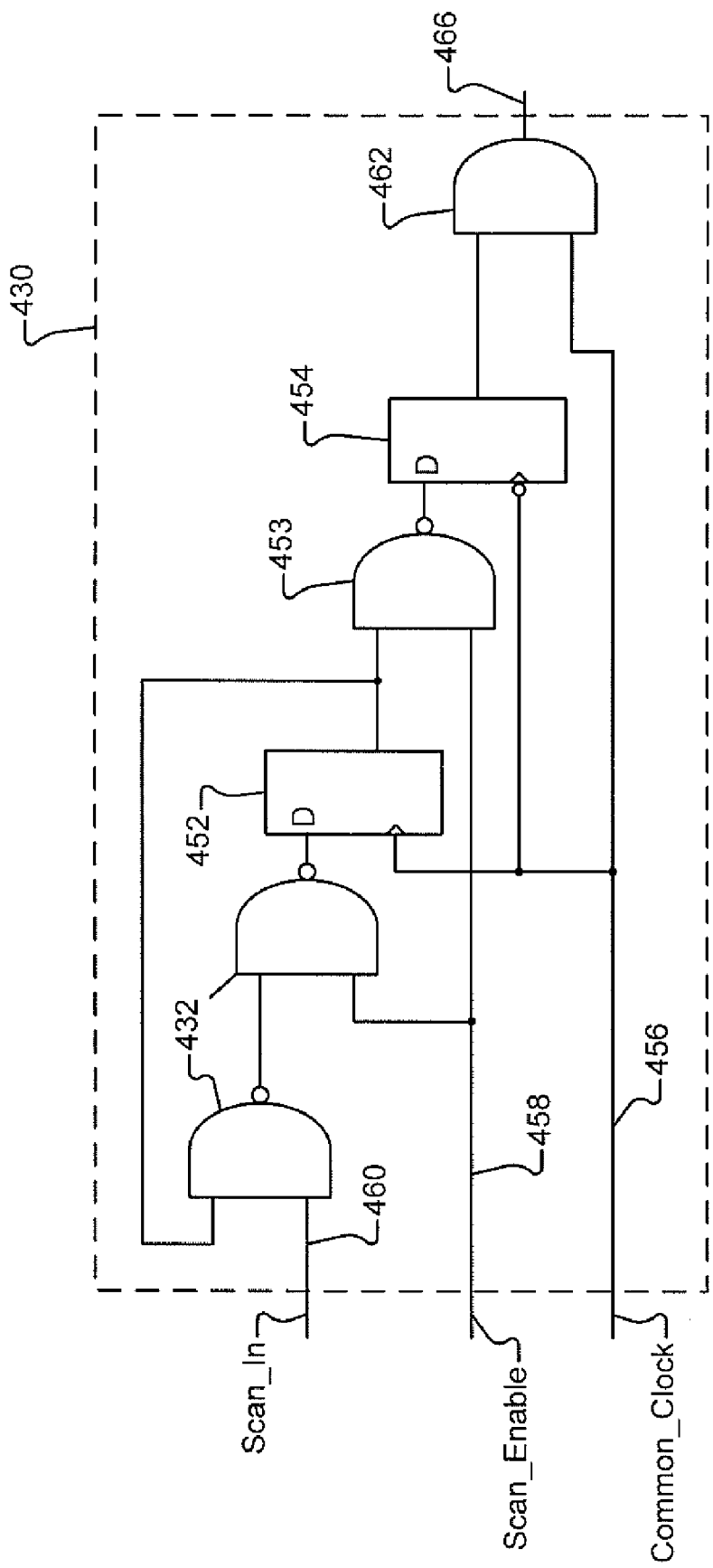
FIG. 12 is a functional block diagram of a clock control module that may be included in the clock control circuit.

Referring now to FIG. 12, a functional block diagram of a clock control module 430 that may be included in the clock control circuit 360 of FIG. 9B. The clock control module 430 includes a pair of NAND gates 432, which receive a scan test data signal Scan_In. The NAND gates 432 communicate in series and output thereof are provided to a flip-flop 452. Output of the flip-flop 452 is provided to a third NAND gate 453, which in turn communicates with a latch 454. The flip-flop 452 changes state based on a rising edge of a received clock signal and the latch 454 changes states based on a negative-edge of the received clock signal. The flip-flop 452 and the latch 454 operate on a common clock signal Common-Clock on line 456. Output of the latch 454 and the common clock signal Common_Clock are provided to an AND gate 462 to generate a gated-clock signal 466, such as the gated clock signal 364.

After initialization with a control or enable signal Scan_Enable on line 458 set to logic "0", the flip-flop 452 is set to "1" and the latch 454 is set to "1". This allows passage of clock pulses from line 456 through to scan chain state variable devices, such as the flip-flops 402 of FIG. 10.

On a first rising-edge of a clock pulse on line 456, after the enable signal Scan_Enable is set to "1", a scan test data signal Scan_In on line 460 is loaded into flip-flop 452. Line 460 is gated by positive polarity output from the flip-flop 452 and the enable signal Scan_Enable. On a following falling-edge of the clock pulse on line 456 the value in the flip-flop 452 is inverted through NAND gate 453 and is transferred into the latch 454. Positive polarity output of the latch 454 forms an enable signal on line 464 to pass or block clocks pulses to scan chains. Clock signals provided to scan chains are ON when the scan test data signal Scan_In has values set to "0", and are OFF or blocked otherwise.

Referring now to FIGS. 13A-13G, various exemplary implementations incorporating the teachings of the present disclosure are shown. The above-described scan testing techniques may be applied to CUTs of various circuits, which are included in various devices, such as those provided with respect to FIGS. 13A-13G. In addition, a scan-based testing system, such as that described with respect to FIG. 2, may be in communication with one or more of the devices of FIGS. 13A-13G. For example, a scan-based testing system may receive scan test data from a hard disk drive (HDD) and/or provide scan output data to the HDD.

Figure 13A:
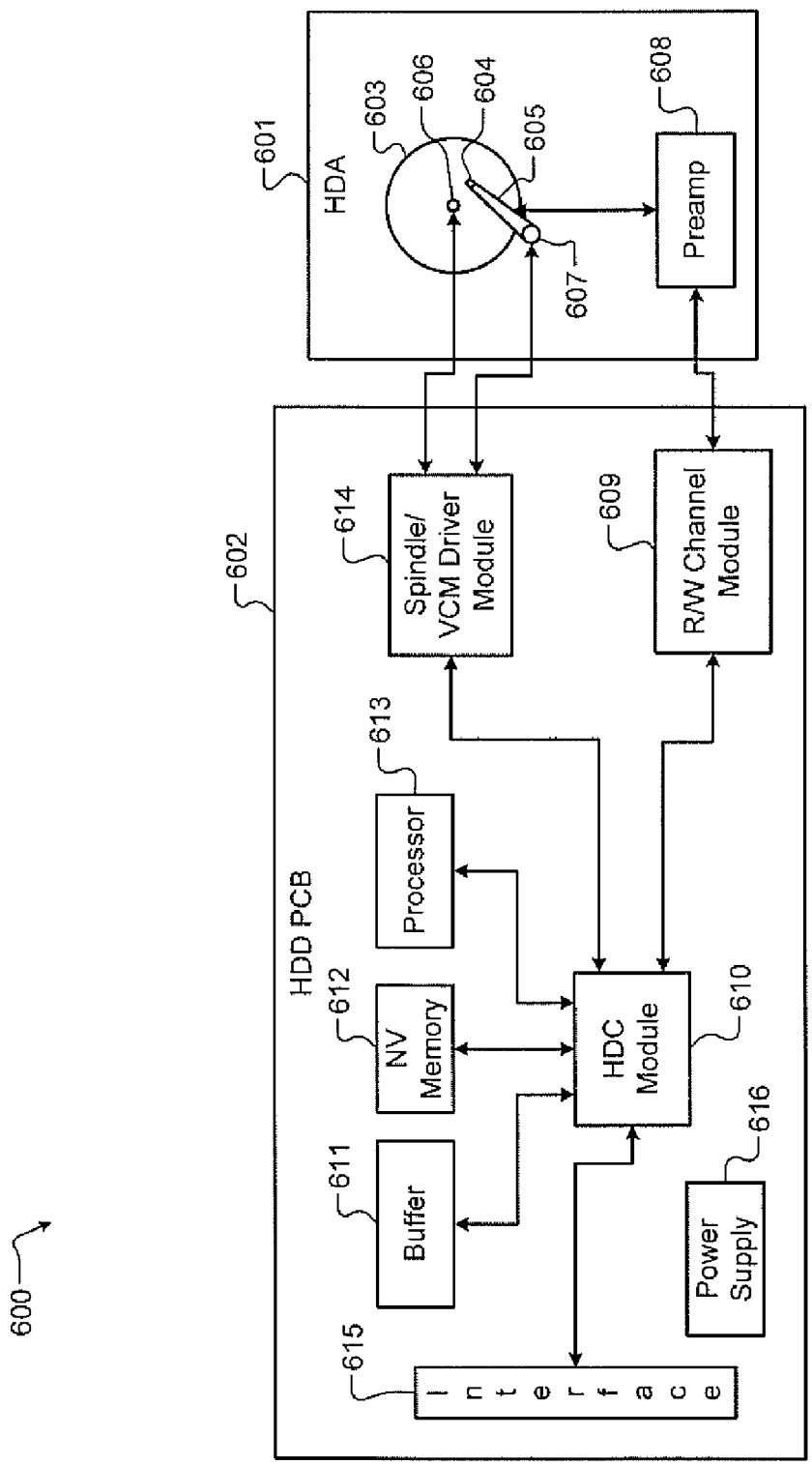
FIG. 13A is a functional block diagram of a hard disk drive.

Referring now to FIG. 13A, the teachings of the disclosure can be used to test CUTs of a HDD 600. The CUTs of the HDD 600 may include clock generation circuits and compressor networks, as described above. The HDD 600 includes a hard disk assembly (HDA) 601 and an HDD printed circuit board (PCB) 602. The HDA 601 may include a magnetic medium 603, such as one or more platters that store data, and a read/write device 604. The read/write device 604 may be arranged on an actuator arm 605 and may read and write data on the magnetic medium 603. Additionally, the HDA 601 includes a spindle motor 606 that rotates the magnetic medium 603 and a voice-coil motor (VCM) 607 that actuates the actuator arm 605. A preamplifier device 608 amplifies signals generated by the read/write device 604 during read operations and provides signals to the read/write device 604 during write operations.

The HDD PCB 602 includes a read/write channel module (hereinafter, "read channel") 609, a hard disk controller (HDC) module 610, a buffer 611, nonvolatile memory 612, a processor 613, and a spindle/VCM driver module 614. The read channel 609 processes data received from and transmitted to the preamplifier device 608. The HDC module 610 controls components of the HDA 601 and communicates with an external device (not shown) via an I/O interface 615. The external device may include a computer, a multimedia device, a mobile computing device, etc. The I/O interface 615 may include wireline and/or wireless communication links.

The HDC module 610 may receive data from the HDA 601, the read channel 609, the buffer 611, nonvolatile memory 612, the processor 613, the spindle/VCM driver module 614, and/or the I/O interface 615. The processor 613 may process the data, including encoding, decoding, filtering, and/or formatting. The processed data may be output to the HDA 601, the read channel 609, the buffer 611, nonvolatile memory 612, the processor 613, the spindle/VCM driver module 614, and/or the I/O interface 615.

The HDC module 610 may use the buffer 611 and/or nonvolatile memory 612 to store data related to the control and operation of the HDD 600. The buffer 611 may include DRAM, SDRAM, etc. The nonvolatile memory 612 may include flash memory (including NAND and NOR flash memory), phase change memory, magnetic RAM, or multi-state memory, in which each memory cell has more than two states. The spindle/VCM driver module 614 controls the spindle motor 606 and the VCM 607. The HDD PCB 602 includes a power supply 616 that provides power to the components of the HDD 600.

Figure 13B:
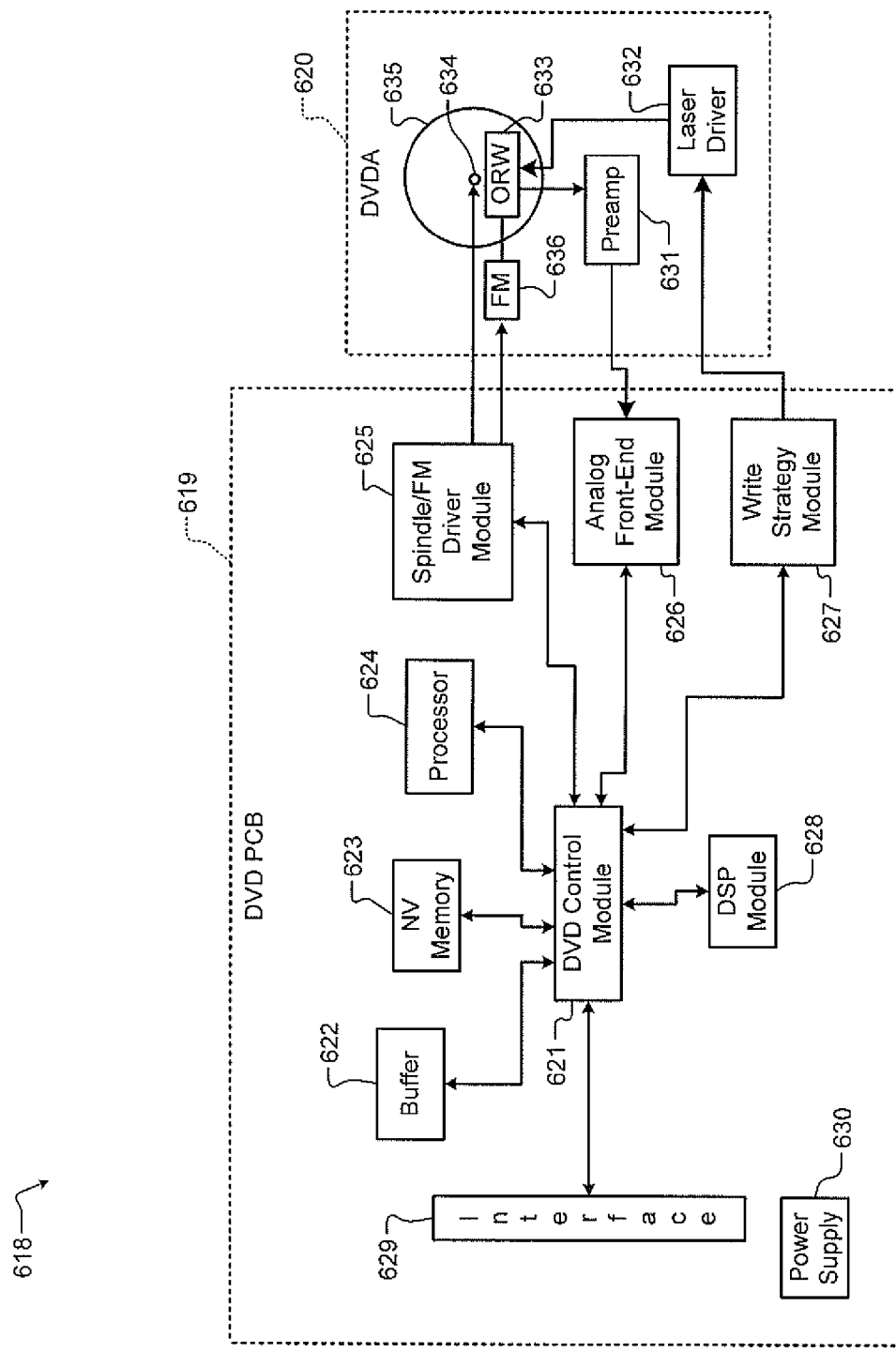
FIG. 13B is a functional block diagram of a DVD drive.

Referring now to FIG. 13B, the teachings of the disclosure can be used to test CUTs of a DVD drive 618 or of a CD drive (not shown). The CUTs of the DVD drive 618 may include clock generation circuits and compressor networks, as described above. The DVD drive 618 includes a DVD PCB 619 and a DVD assembly (DVDA) 620. The DVD PCB 619 includes a DVD control module 621, a buffer 622, nonvolatile memory 623, a processor 624, a spindle/FM (feed motor) driver module 625, an analog front-end module 626, a write strategy module 627, and a DSP module 628.

The DVD control module 621 controls components of the DVDA 620 and communicates with an external device (not shown) via an I/O interface 629. The external device may include a computer, a multimedia device, a mobile computing device, etc. The I/O interface 629 may include wireline and/or wireless communication links.

The DVD control module 621 may receive data from the buffer 622, nonvolatile memory 623, the processor 624, the spindle/FM driver module 625, the analog front-end module 626, the write strategy module 627, the DSP module 628, and/or the I/O interface 629. The processor 624 may process the data, including encoding, decoding, filtering, and/or formatting. The DSP module 628 performs signal processing, such as video and/or audio coding/decoding. The processed data may be output to the buffer 622, nonvolatile memory 623, the processor 624, the spindle/FM driver module 625, the analog front-end module 626, the write strategy module 627, the DSP module 628, and/or the I/O interface 629.

The DVD control module 621 may use the buffer 622 and/or nonvolatile memory 623 to store data related to the control and operation of the DVD drive 618. The buffer 622 may include DRAM, SDRAM, etc. The nonvolatile memory 623 may include flash memory (including NAND and NOR flash memory), phase change memory, magnetic RAM, or multi-state memory, in which each memory cell has more than two states. The DVD PCB 619 includes a power supply 630 that provides power to the components of the DVD drive 618.

The DVDA 620 may include a preamplifier device 631, a laser driver 632, and an optical device 633, which may be an optical read/write (ORW) device or an optical read-only (OR) device. A spindle motor 634 rotates an optical storage medium 635, and a feed motor 636 actuates the optical device 633 relative to the optical storage medium 635.

When reading data from the optical storage medium 635, the laser driver provides a read power to the optical device 633. The optical device 633 detects data from the optical storage medium 635, and transmits the data to the preamplifier device 631. The analog front-end module 626 receives data from the preamplifier device 631 and performs such functions as filtering and A/D conversion. To write to the optical storage medium 635, the write strategy module 627 transmits power level and timing data to the laser driver 632. The laser driver 632 controls the optical device 633 to write data to the optical storage medium 635.

Figure 13D:
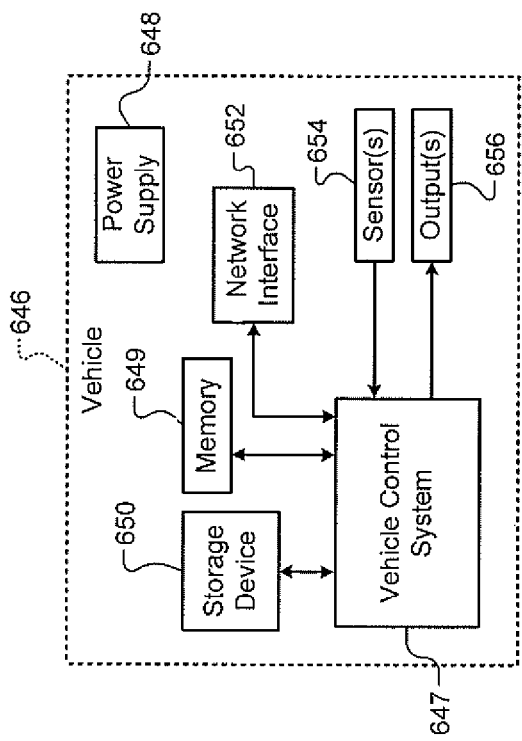
FIG. 13D is a functional block diagram of a vehicle control system.
Figure 13C:
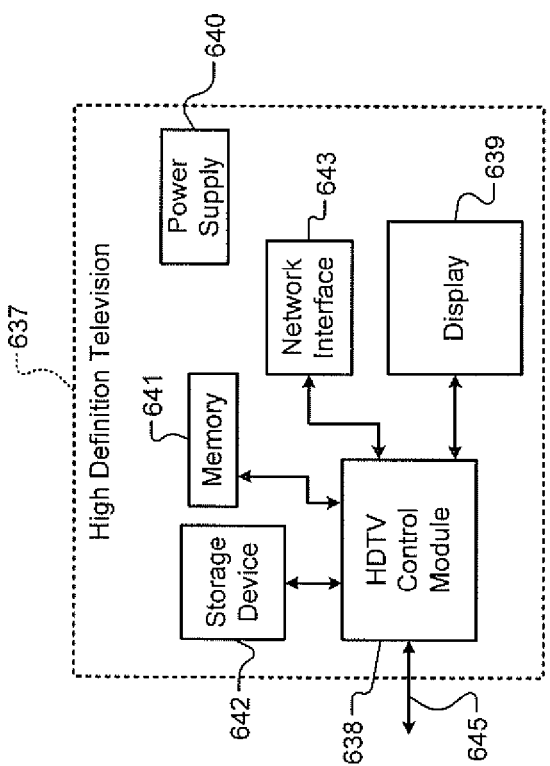
FIG. 13C is a functional block diagram of a high definition television.

Referring now to FIG. 13C, the teachings of the disclosure can be used to test CUTs of a high definition television (HDTV) 637. The CUTs of the HDTV 637 may include clock generation circuits and compressor networks, as described above. The HDTV 637 includes an HDTV control module 638, a display 639, a power supply 640, memory 641, a storage device 642, a network interface 643, and an external interface 645. If the network interface 643 includes a wireless local area network interface, an antenna (not shown) may be included.

The HDTV 637 can receive input signals from the network interface 643 and/or the external interface 645, which can send and receive data via cable, broadband Internet, and/or satellite. The HDTV control module 638 may process the input signals, including encoding, decoding, filtering, and/or formatting, and generate output signals. The output signals may be communicated to one or more of the display 639, memory 641, the storage device 642, the network interface 643, and the external interface 645.

Memory 641 may include random access memory (RAM) and/or nonvolatile memory such as flash memory, phase change memory, or multi-state memory, in which each memory cell has more than two states. The storage device 642 may include an optical storage drive, such as a DVD drive, and/or a hard disk drive (HDD). The HDTV control module 638 communicates externally via the network interface 643 and/or the external interface 645. The power supply 640 provides power to the components of the HDTV 637.

Referring now to FIG. 13D, the teachings of the disclosure can be used to test CUTs of a vehicle 646. The CUTs of the vehicle 646 may include clock generation circuits and compressor networks, as described above. The vehicle 646 may include a vehicle control system 647, a power supply 648, memory 649, a storage device 650, and a network interface 652. If the network interface 652 includes a wireless local area network interface, an antenna (not shown) may be included. The vehicle control system 647 may be a powertrain control system, a body control system, an entertainment control system, an anti-lock braking system (ABS), a navigation system, a telematics system, a lane departure system, an adaptive cruise control system, etc.

The vehicle control system 647 may communicate with one or more sensors 654 and generate one or more output signals 656. The sensors 654 may include temperature sensors, acceleration sensors, pressure sensors, rotational sensors, airflow sensors, etc. The output signals 656 may control engine operating parameters, transmission operating parameters, suspension parameters, etc.

The power supply 648 provides power to the components of the vehicle 646. The vehicle control system 647 may store data in memory 649 and/or the storage device 650. Memory 649 may include random access memory (RAM) and/or nonvolatile memory such as flash memory, phase change memory, or multi-state memory, in which each memory cell has more than two states. The storage device 650 may include an optical storage drive, such as a DVD drive, and/or a hard disk drive (HDD). The vehicle control system 647 may communicate externally using the network interface 652.

Figure 13F:
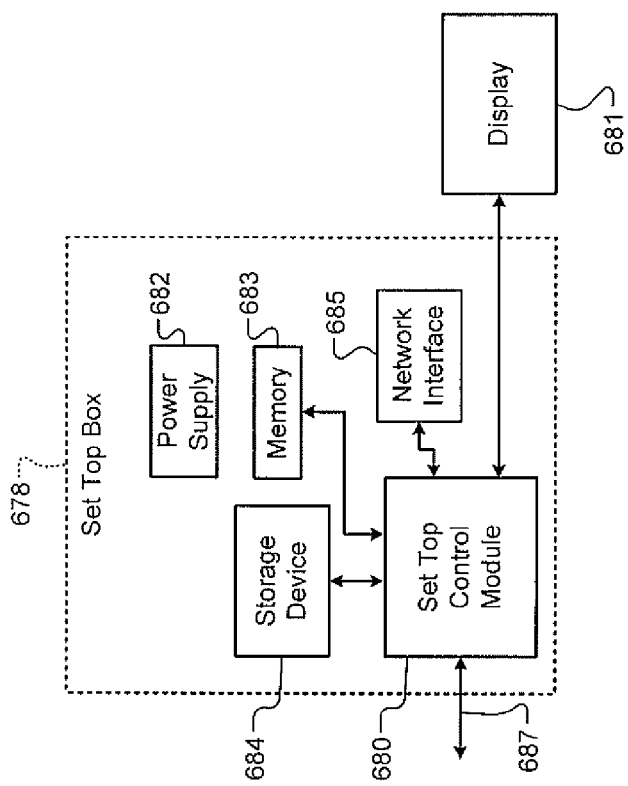
FIG. 13F is a functional block diagram of a set top box.
Figure 13E:
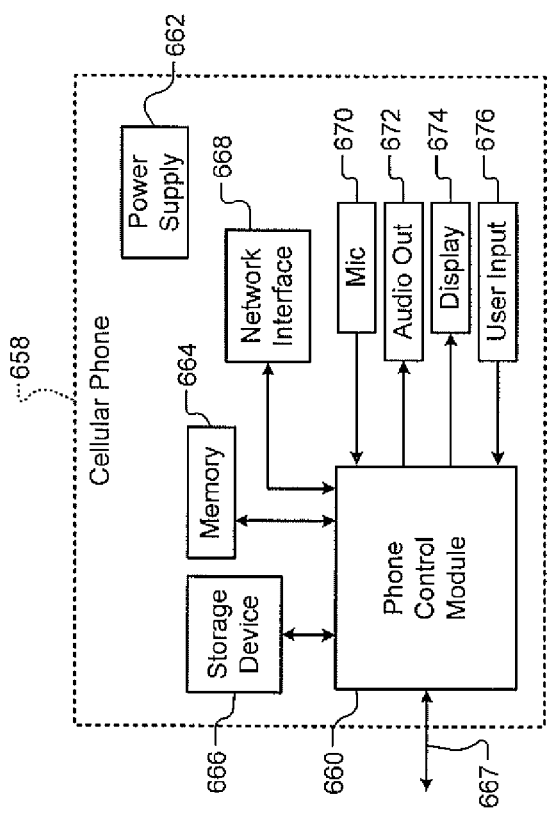
FIG. 13E is a functional block diagram of a cellular phone.

Referring now to FIG. 13E, the teachings of the disclosure can be used to test CUTs of a cellular phone 658. The CUTs of the cellular phone 658 may include clock generation circuits and compressor networks, as described above. The cellular phone 658 includes a phone control module 660, a power supply 662, memory 664, a storage device 666, and a cellular network interface 667. The cellular phone 658 may include a network interface 668, a microphone 670, an audio output 672 such as a speaker and/or output jack, a display 674, and a user input device 676 such as a keypad and/or pointing device. If the network interface 668 includes a wireless local area network interface, an antenna (not shown) may be included.

The phone control module 660 may receive input signals from the cellular network interface 667, the network interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the network interface 668, and the audio output 672.

Memory 664 may include random access memory (RAM) and/or nonvolatile memory such as flash memory, phase change memory, or multi-state memory, in which each memory cell has more than two states. The storage device 666 may include an optical storage drive, such as a DVD drive, and/or a hard disk drive (HDD). The power supply 662 provides power to the components of the cellular phone 658.

Referring now to FIG. 13F, the teachings of the disclosure can be used to test CUTs of a set top box 678. The CUTs of the set top box 678 may include clock generation circuits and compressor networks, as described above. The set top box 678 includes a set top control module 680, a display 681, a power supply 682, memory 683, a storage device 684, and a network interface 685. If the network interface 685 includes a wireless local area network interface, an antenna (not shown) may be included.

The set top control module 680 may receive input signals from the network interface 685 and an external interface 687, which can send and receive data via cable, broadband Internet, and/or satellite. The set top control module 680 may process signals, including encoding, decoding, filtering, and/or formatting, and generate output signals. The output signals may include audio and/or video signals in standard and/or high definition formats. The output signals may be communicated to the network interface 685 and/or to the display 681. The display 681 may include a television, a projector, and/or a monitor.

The power supply 682 provides power to the components of the set top box 678. Memory 683 may include random access memory (RAM) and/or nonvolatile memory such as flash memory, phase change memory, or multi-state memory, in which each memory cell has more than two states. The storage device 684 may include an optical storage drive, such as a DVD drive, and/or a hard disk drive (HDD).

Referring now to FIG. 13G, the teachings of the disclosure can be used to test CUTs of a mobile device 689. The CUTs of the mobile device 689 may include clock generation circuits and compressor networks, as described above. The mobile device 689 may include a mobile device control module 690, a power supply 691, memory 692, a storage device 693, a network interface 694, and an external interface 699. If the network interface 694 includes a wireless local area network interface, an antenna (not shown) may be included.

The mobile device control module 690 may receive input signals from the network interface 694 and/or the external interface 699. The external interface 699 may include USB, infrared, and/or Ethernet. The input signals may include compressed audio and/or video, and may be compliant with the MP3 format. Additionally, the mobile device control module 690 may receive input from a user input 696 such as a keypad, touchpad, or individual buttons. The mobile device control module 690 may process input signals, including encoding, decoding, filtering, and/or formatting, and generate output signals.

The mobile device control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory such as flash memory, phase change memory, or multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
a first shift clock configured to generate a first clock signal;
a first scan chain comprising
(i) a first input configured to receive a portion of first data to test the first scan chain,
(ii) a first set of devices, wherein each of the first set of devices has a first plurality of states, wherein each of the first set of devices is configured to change between the first plurality of states in response to the portion of the first data, and wherein the first plurality of states change at a rate of the first shift clock, and
(iii) a first output configured to output a portion of second data in response to the first plurality of states; and
a first sampling circuit configured to sample the portion of the second data from the first output at least twice per clock cycle of the first clock signal.

2. The system of claim 1, further comprising:
a second scan chain comprising
(i) a second input configured to receive a portion of third data to test the second scan chain,
(ii) a second set of devices, wherein each of the second set of devices has a second plurality of states, and wherein each of the second set of devices is configured to change between the second plurality of states in response to the portion of the third data, and
(iii) a second output configured to output a portion of fourth data in response to the second plurality of states; and
a second sampling circuit configured to sample the portion of the fourth data from the second output at least twice per clock cycle of one of the first clock signal and a second clock signal.

3. The system of claim 2, further comprising an inverter configured to invert the first clock signal to generate the second clock signal.

4. The system of claim 2, further comprising a second shift clock configured to generate the second clock signal, wherein the second plurality of states change at a rate of the second shift clock.

5. The system of claim 2, wherein:
the second scan chain is configured to receive the portion of the third data while the first scan chain is configured to receive the portion of the first data; and
the second scan chain is configured to generate the portion of the fourth data offset in time relative to when the portion of the second data is output from the first scan chain.

6. The system of claim 2, wherein:
the first scan chain comprises a first element, wherein the first element is a last element in the first scan chain;
the first element is configured to change state in response to a rising edge of the first clock signal;
the second scan chain comprises a second element, wherein the second element is a last element in the second scan chain; and
the second element is configured to change state in response to a falling edge of one of the first clock signal and the second clock signal.

7. The system of claim 2, further comprising:
a first set of scan chains comprising the first scan chain, wherein the first set of scan chains are configured to (i) receive the first data, and (ii) output the second data;
a first compressor configured to (i) receive the second data, and (ii) generate a first output signal;
a second set of scan chains comprising the second scan chain, wherein the second set of scan chains is configured to (i) receive the third data, and (ii) output the fourth data;
a second compressor configured to (i) receive the fourth data, and (ii) generate a second output signal; and
a multiplexer configured to, in response to the first clock signal, select one of the first output signal and the second output signal.

8. The system of claim 7, wherein:
the first compressor is configured to (i) receive the first clock signal, (ii) compress the second data, and (iii) generate the first output signal based on the compression of the second data; and
the second compressor is configured to (i) receive the second clock signal, (ii) compress the fourth data, and (iii) generate the second output signal based on the compression of the fourth data.

9. The system of claim 8, wherein:
the first compressor comprises first flip flops and a first compression logic devices, wherein the first flip flops are configured to change states in response to the first clock signal;
an inverter configured to generate the second clock signal in response to the first clock signal; and the second compressor comprises second flip flops and second compression logic devices, wherein the second flip flops are configured to change states in response to the second clock signal.

10. The system of claim 2, further comprising:
a first set of scan chains comprising the first scan chain and configured to (i) receive the first data, and (ii) output the second data;
a first compressor configured to receive the second data and generate a first output signal;
a second set of scan chains comprising the second scan chain and configured to (i) receive the third data, and (ii) output the fourth data;
a second compressor configured to receive the fourth data and generate a second output signal;
a third set of scan chains;
a third compressor configured to generate a third output signal based on an output of the third set of scan chains;
a fourth set of scan chains;
a fourth compressor configured to generate a fourth output signal based on an output of the fourth set of scan chains; and
a multiplexer configured to, in response to the first clock signal and the second clock signal, select one of the first output signal, the second output signal, the third output signal, and the fourth output signal.

11. The system of claim 10, wherein the second clock signal is out of phase with the first clock signal.

12. The system of claim 10, wherein:
the first compressor is configured generate the first output signal in response to the first clock signal;
the second compressor is configured generate the second output signal in response to the second clock signal;
the third compressor is configured generate the third output signal in response to an inversion of the first clock signal; and
the fourth compressor is configured generate the fourth output signal in response to an inversion of the second clock signal.

13. The system of claim 12, wherein the second clock signal is out of phase with the first clock signal.

14. The system of claim 2, further comprising:
a first compressor configured to receive the second data and generate a first output signal;
a second compressor configured to receive the fourth data and generate a second output signal; and
a multiplexer configured to, in response to the first clock signal, select one of the first output signal and the second output signal; and
a control module configured to detect faults in the first scan chain or the second scan chain based on an output of the multiplexer.

15. The system of claim 1, further comprising a control module configured to (i) monitor the second data, and (ii) detect faults with the first set of devices based on the second data.

16. The system of claim 15, wherein the control module is configured to compare the second data to a test pattern or expected results to detect the faults.

17. The system of claim 1, further comprising:
a circuit comprising the first scan chain; and
a control module configured to (i) monitor the second data, and (ii) detect faults with the circuit based on the second data.

18. The system of claim 1, wherein the portion of the first data is shifted into the first scan chain at a rate of the first shift clock.

19. The system of claim 1, wherein the first output is configured to output the portion of the second data at a rate of the first shift clock.

20. A method comprising:
generating a first clock signal;
receiving a portion of first data via a first scan chain to test the first scan chain;
changing between a first plurality of states in each of a first set of devices in the first scan chain in response to the portion of the first data;
outputting a portion of second data from the first scan chain in response to the first plurality of states;
sampling the portion of the second data at least twice per clock cycle of the first clock signal;
receiving a portion of third data via a second scan chain to test the second scan chain;
changing between a second plurality of states in each of a second set of devices in the second scan chain in response to the portion of the third data;
outputting a portion of fourth data from the second scan chain in response to the second plurality of states; and
sampling the portion of the fourth data at least twice per clock cycle of a second clock signal, wherein a rate of the second clock signal is different than a rate of the first clock signal.

21. The method of claim 20, wherein:
the first scan chain ends with a first element;
changing state of the first element in response to a rising edge of the first clock signal;
the second scan chain ends with a second element; and
changing state of the second element in response to a falling edge of one of the first clock signal and the second clock signal.

22. The method of claim 20, further comprising:
monitoring the second data and the fourth data; and
comparing the second data and the fourth data to expected data to detect faults with at least one of the first set of devices and the second set of devices.

* * * * *